US008787595B2

(12) United States Patent
Urata

(10) Patent No.: US 8,787,595 B2
(45) Date of Patent: Jul. 22, 2014

(54) AUDIO SIGNAL ADJUSTMENT DEVICE AND AUDIO SIGNAL ADJUSTMENT METHOD HAVING LONG AND SHORT TERM GAIN ADJUSTMENT

(75) Inventor: Shigefumi Urata, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 524 days.

(21) Appl. No.: 13/124,826

(22) PCT Filed: Oct. 15, 2009

(86) PCT No.: PCT/JP2009/067834
§ 371 (c)(1),
(2), (4) Date: Jul. 8, 2011

(87) PCT Pub. No.: WO2010/044439
PCT Pub. Date: Apr. 22, 2010

(65) Prior Publication Data
US 2011/0255712 A1   Oct. 20, 2011

(30) Foreign Application Priority Data
Oct. 17, 2008   (JP) ................................ 2008-268742

(51) Int. Cl.
*H03G 3/00*   (2006.01)
(52) U.S. Cl.
USPC .......................................... 381/107; 381/104
(58) Field of Classification Search
None
See application file for complete search history.

(56) References Cited

U.S. PATENT DOCUMENTS

| 4,922,535 | A  | * | 5/1990  | Dolby ........................... 704/500 |
| 5,381,482 | A  |   | 1/1995  | Matsumoto et al. |
| 5,666,424 | A  | * | 9/1997  | Fosgate et al. .................. 381/18 |
| 2007/0076905 | A1 |   | 4/2007  | Konagai et al. |
| 2007/0291959 | A1 | * | 12/2007 | Seefeldt ........................ 381/104 |
| 2008/0253586 | A1 | * | 10/2008 | Wei ................................ 381/107 |
| 2009/0074209 | A1 | * | 3/2009  | Thompson et al. ........... 381/107 |
| 2010/0046765 | A1 | * | 2/2010  | De Bruijn et al. .............. 381/58 |

FOREIGN PATENT DOCUMENTS

| JP | 5-90857 A    | 4/1993  |
| JP | 5-243881 A   | 9/1993  |
| JP | 6-169229 A   | 6/1994  |
| JP | 7-122953 A   | 5/1995  |
| JP | 2003-299181 A | 10/2003 |

(Continued)

OTHER PUBLICATIONS
International serach report dated Jan. 19, 2010 for PCT/JP2009/067834.

*Primary Examiner* — Joseph Saunders, Jr.
*Assistant Examiner* — James Mooney
(74) *Attorney, Agent, or Firm* — Birch, Stewart, Kolasch & Birch, LLP

(57) ABSTRACT

To perform volume control matching the actual auditory sensation level of a human so as to improve the control accuracy. As shown in FIG. 1, an audio gain adjustment device 10 includes: an audio signal input section 12 that acquires an audio signal to be adjusted; a long-term gain reflection section 14 that reflects the adjustment of long-term gain in the acquired audio signal; a frequency division section 20 that divides the audio signal from the long-term gain reflection section 14 into three frequency bands; a short-term gain reflection section 30 that reflects the adjustment of short-term gain in each frequency band; a synthesis section 40 that synthesizes audio signals output from the short-term gain reflection section 30; and an audio signal output section 42 that outputs the synthesized audio signal.

16 Claims, 21 Drawing Sheets

(56) References Cited

FOREIGN PATENT DOCUMENTS

| JP | 2005-191851 A | 7/2005 |
| JP | 2005-229544 A | 8/2005 |
| JP | 4013906 B2 | 11/2007 |
| JP | 2008-518565 A | 5/2008 |
| WO | WO 02/15395 A1 | 2/2002 |
| WO | WO 2006/047600 A | 5/2006 |
| WO | WO 2007/127023 A1 | 11/2007 |

* cited by examiner

AUDIO SIGNAL ADJUSTMENT DEVICE AND AUDIO SIGNAL ADJUSTMENT METHOD HAVING LONG AND SHORT TERM GAIN ADJUSTMENT

TECHNICAL FIELD

The present invention relates to an audio signal adjustment device and an audio signal adjustment method and, more particularly, to an audio signal adjustment device and an audio signal adjustment method that adjust an audio signal by automatic gain adjustment.

BACKGROUND ART

Today, there are various media sources, such as digital broadcasting, VOD (Video On Demand) broadcasting, DVD (Digital Versatile Disk), and Blu-Ray® disk, and users enjoy these sources while switching from one source to another freely. However, a producer or broadcasting station differs for each source, so that audio recording level or audio dynamic range often differs between the media sources, resulting in output of surprising loud sound or output of poor sound that is hard to hear at the time of switching from one program to another or from one source to another. Accordingly, inconveniently, the user needs to adjust the volume to a desired level every time the volume is changed.

There are proposed some techniques for adjusting the above difference in volume or dynamic range between media sources. For example, there is known a technique that performs gain adjustment for respective signals obtained by frequency division and adds the resultant signals once again for averaging a signal level (refer to Patent Document 1). Using this technique prevents the lack of a high-frequency component to thereby prevent sound from being made unclear.

CITATION LIST

Patent Document

[Patent Document 1] Jpn. Pat. Appln. Laid-Open Publication No. 2003-299181

DISCLOSURE OF THE INVENTION

Problems to be Solved by the Invention

In the technique disclosed in Patent Document 1, since gain is made to change with respect to the voltage value of an input signal, volume control does not correspond to the actual auditory sensation level of a human and thus needs to be improved in terms of control accuracy. Further, in the case where the level is high (or low) as a whole, a change amount of gain with respect to a change in the input signal is large, which unfavorably increases a fluctuation of an output signal.

An object of the present invention is to provide a technique for performing volume control matching the actual auditory sensation level of a human so as to improve the control accuracy.

Means for Solving the Problems

A device according to the present invention relates to an audio signal adjustment device. The device includes a long-term gain adjustment means for relatively controlling an amplitude of an input signal on a long-term basis and a short-term gain adjustment means for relatively controlling the amplitude of the input signal on a short-term basis.

When controlling the amplitude of the input signal, the long-term gain adjustment means may convert the input signal into a loudness level which is a level based on auditory sense of a human.

When controlling the amplitude of the input signal, the short-term gain adjustment means may convert the input signal into a loudness level which is a level based on auditory sense of a human.

The long-term gain adjustment means may reflect output sound pressure characteristics of audio output means which is an output destination of a signal of the audio signal adjustment device to control the amplitude of the input signal.

The short-term gain adjustment means may reflect output sound pressure characteristics of audio output means which is an output destination of a signal of the audio signal adjustment device to control the amplitude of the input signal.

The long-term gain adjustment means and short-term gain adjustment means each may control the amplitude based on the input signal buffered for a certain period of time.

The input signal buffered for a certain period of time may be a read-ahead signal.

The long-term gain adjustment means may reflect an input signal that has been subjected to previous long-term gain adjustment so as to perform feed-back control.

The short-term gain adjustment means may reflect a signal that has been subjected to the long-term gain control performed by the long-term gain adjustment means so as to perform control.

The short-term gain adjustment means may perform control of the amplitude of the input signal for each of an audio band and the other one of the input signal.

The short-term gain adjustment means may change attack time in accordance with the rising degree of an input signal in controlling the amplitude of the short-term gain.

The short-term gain adjustment means may calculate the rising degree of the input signal based on the loudness level of the input signal and standard deviation and average value of the loudness level.

The short-term gain adjustment means may change the amplitude amount of the short-term gain in accordance with the rising degree of the loudness level of the input signal in controlling the amplitude of the short-term gain.

The short-term gain adjustment means may calculate a change width of the short-term gain every time it calculates a target gain of the input signal.

The long-term gain adjustment means may adjust the long-term gain in accordance with a change in the control of the short-term gain in the short-term gain adjustment means.

Further, the audio signal adjustment device may include a comparison means for comparing a level of the input signal and a preset threshold value level so as to calculate a difference level; a level change degree calculation means for comparing a level of the input signal input within a given past time period and a level of the currently being input so as to calculate a level change degree; a gain adjustment amount calculation means for calculating the adjustment amount of the gain used in gain adjustment processing to be applied to the input signal in accordance with the difference level calculated in the comparison means; and a gain adjustment means for applying adjustment to the input signal according to the gain adjustment amount calculated in the gain adjustment amount calculation means.

Further, the audio signal adjustment device may include a source/content identification means for identifying a source of the input signal or a category of a content including the input signal, and the gain adjustment amount calculation means may be capable of setting a calculation procedure of the gain adjustment amount depending on the source or category identified by in the source/content identification means.

Another aspect of the present invention relates to an audio signal adjustment method. The method includes a long-term gain adjustment step of relatively controlling an amplitude of an input signal on a long-term basis and a short-term gain adjustment step of relatively controlling the amplitude of the input signal on a short-term basis.

When controlling the amplitude of the input signal, the long-term gain adjustment step may convert the input signal into a loudness level which is a level based on auditory sense of a human.

When controlling the amplitude of the input signal, the short-term gain adjustment step may convert the input signal into a loudness level which is a level based on auditory sense of a human.

The long-term gain adjustment step may reflect output sound pressure characteristics of audio output means which is an output destination of a signal controlled by the audio signal adjustment method to control the amplitude of the input signal.

The short-term gain adjustment step may reflect output sound pressure characteristics of audio output means which is an output destination of a signal controlled by the audio signal adjustment method to control the amplitude of the input signal.

The long-term gain adjustment step and short-term gain adjustment step each may control the amplitude based on the input signal buffered for a certain period of time.

The input signal buffered for a certain period of time may be a read-ahead signal.

The long-term gain adjustment step may reflect an input signal that has been subjected to previous long-term gain control so as to perform feed-back control.

The short-term gain adjustment step may reflect a signal that has been subjected to the long-term gain control performed by the long-term gain adjustment step so as to perform control.

The short-term gain adjustment step may perform control of the amplitude of the input signal for each of an audio band and the other one of the input signal.

The short-term gain adjustment step may change attack time in accordance with the rising degree of an input signal in controlling the amplitude of the short-term gain.

The short-term gain adjustment step may calculate the rising degree of the input signal based on the loudness level of the input signal and standard deviation and average value of the loudness level.

The short-term gain adjustment step may change the amplitude amount of the short-term gain in accordance with the rising degree of the loudness level of the input signal in controlling the amplitude of the short-term gain.

The short-term gain adjustment step may calculate a change width of the short-term gain every time it calculates a target gain of the input signal.

The long-term gain adjustment step may adjust the long-term gain in accordance with a change in the control of the short-term gain in the short-term gain adjustment step.

Still another aspect of the present invention relates to an audio signal adjustment device. The device includes: a comparison means for acquiring an input signal and comparing a level of the input signal and a preset threshold value level so as to calculate a difference level; a level change degree calculation means for comparing a level of the input signal input within a given past time period and a level of the input signal currently being input so as to calculate a level change degree; a gain adjustment amount calculation means for calculating a compression ratio based on the differential level calculated in the comparison means and level change degree calculated in the level change degree calculation means and calculating a gain adjustment amount in accordance with the calculated compression ratio; and a gain adjustment means for applying adjustment to the input signal according to the gain adjustment amount calculated in the gain adjustment amount calculation means.

Still another aspect of the present invention relates to an audio signal adjustment device. The device includes: a comparison means for acquiring an input signal and comparing a level of the input signal and a preset threshold value level so as to calculate a difference level; a level change degree calculation means for comparing a level of the input signal input within a given past time period and a level of the input signal currently being input so as to calculate a level change degree; a gain adjustment amount calculation means for calculating a threshold value for gain adjustment amount calculation based on the differential level calculated in the comparison means and level change degree calculated in the level change degree calculation means and calculating a gain adjustment amount in accordance with the calculated threshold value; and a gain adjustment means for applying adjustment to the input signal according to the gain adjustment amount calculated in the gain adjustment amount calculation means.

Still another aspect of the present invention relates to an audio signal adjustment device. The device includes: a comparison means for acquiring an input signal and comparing a level of the input signal and a preset threshold value level so as to calculate a difference level; a level change degree calculation means for comparing a level of the input signal input within a given past time period and a level of the input signal currently being input so as to calculate a level change degree; a gain adjustment amount calculation means for calculating a threshold value for gain adjustment amount calculation and a compression ratio based on the differential level calculated in the comparison means and level change degree calculated in the level change degree calculation means and calculating a gain adjustment amount in accordance with the calculated threshold and compression ratio; and a gain adjustment means for applying adjustment to the input signal according to the gain adjustment amount calculated in the gain adjustment amount calculation means.

Advantages of the Invention

According to the present invention, it is possible to perform volume control matching the actual auditory sensation level of a human, thereby improve the control accuracy.

BEST MODE FOR CARRYING OUT THE INVENTION

Now, embodiments for practicing the present invention (hereinafter, referred to merely as "embodiment") will be described concretely with reference to the accompanying drawings.

First Embodiment

First, an overview will be given of a first embodiment. An audio gain adjustment device 10 described below performs long-term gain adjustment for an input signal, frequency-band divides the resultant output signal using a band division filter, performs short-term gain adjustment for the output signal of each frequency band, and synthesizes the output signals to obtain final output signal.

Long-term gain is obtained by converting a signal within a certain time period that has been subjected to the long-term gain processing into auditory sensation level of a human (hereinafter, referred to as "loudness level") and comparing the loudness level to a set threshold value (compression threshold value or amplification threshold value). As the loudness level, a level reflecting a loudness curve specified by ITU-R (International Telecommunication Union Radiocommunications Sector) standard may be used. More specifically, by inverting the characteristics represented by the loudness curve, the loudness level can be obtained. The compression threshold value is a threshold value referred to when signal compression processing is performed. The amplification threshold value is a threshold value referred to when signal amplification processing is performed. In addition to the above threshold values, a lower limit threshold value is set in order to prevent background noise and the like from being amplified.

A target value of short-term gain is obtained by converting a signal within a certain time period that has been passed through a band-pass filter (BPF) into the loudness level and comparing the loudness level, together with the loudness level that has been subjected to the long-term gain adjustment, to corresponding threshold values to calculate a short-term gain target value. At the same time, attack time and release time required for the gain to reach the target value are calculated. The short-term gain is made to change based on the calculated target value, attack time, and release time. The functions as described above allow adjustment of sound to an ear-friendly level, which alleviates user's time and energy in operating volume control. The terms "long-term" and "short-term" used in the present embodiment each mean a relative time period, and the "long-term" is assumed to be a time period thirty times longer than the "short-term" and to be adaptively updated. With the above processing, it is possible to ensure a dynamic range intended by a producer of contents (source).

Figure 1:
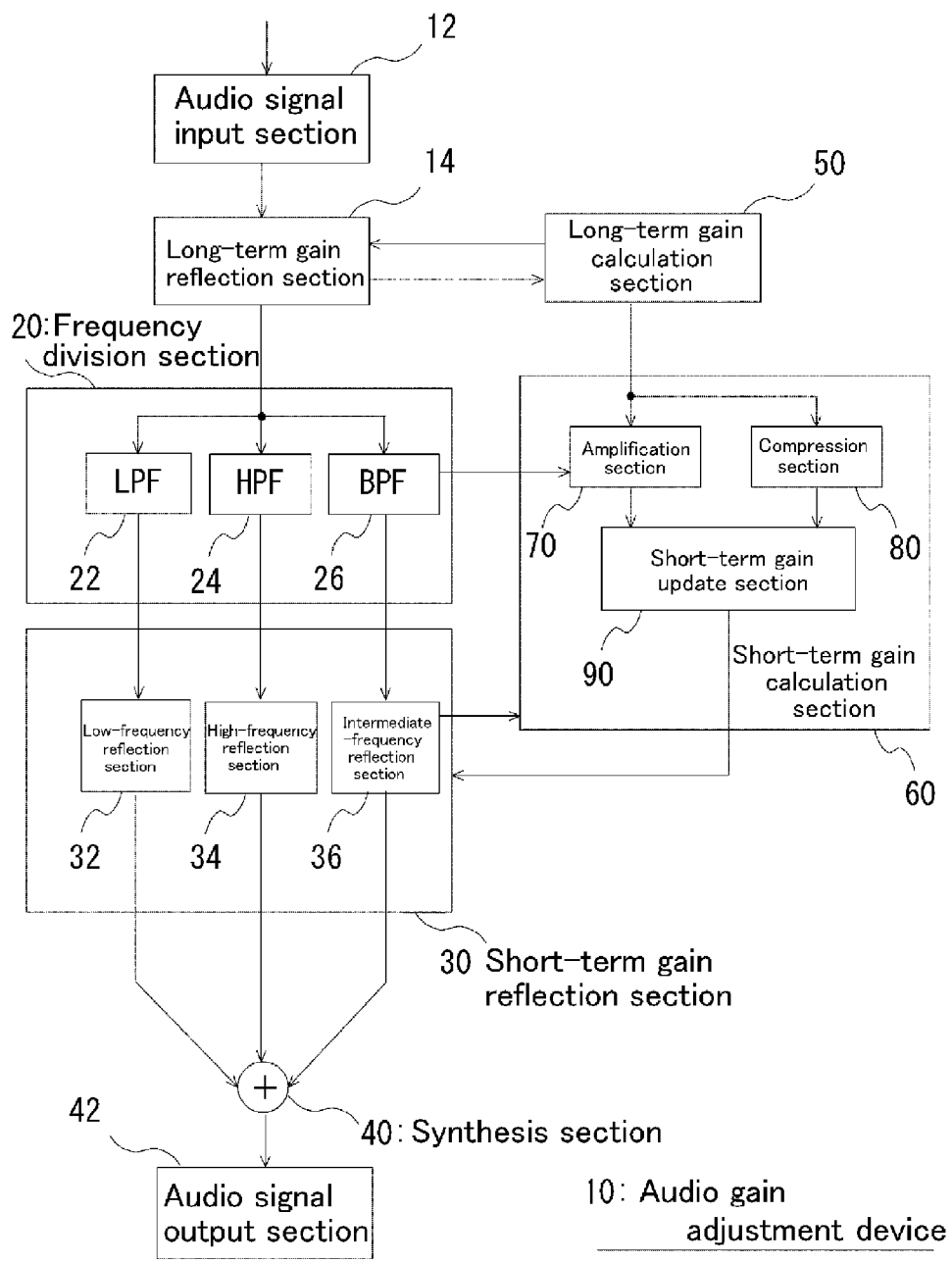
FIG. 1 is a function block diagram of an audio gain adjustment device according to a first embodiment of the present invention.

FIG. 1 is a function block diagram schematically illustrating a configuration of the audio gain adjustment device 10 according to the present embodiment. This audio gain adjustment device 10 is mounted in a TV set or an audio system. Respective components constituting the present embodiment are each realized by an LSI (Large Scale Integrated circuit) such as a DSP (Digital Signal Processor), a memory, or an arbitrary program. As illustrated in FIG. 1, the audio gain adjustment device 10 includes an audio signal input section 12 that acquires an audio signal to be adjusted, a long-term gain reflection section 14 that reflects the adjustment of long-term gain in the acquired audio signal, a frequency division section 20 that divides the audio signal from the long-term gain reflection section 14 into three frequency bands, a short-term gain reflection section 30 that reflects the adjustment of short-term gain in each frequency band, a synthesis section 40 that synthesizes audio signals output from the short-term gain reflection section 30, and an audio signal output section 42 that outputs the synthesized audio signal.

The audio gain adjustment device 10 further includes a long-term gain calculation section 50 that calculates long-term gain used in the long-term gain reflection section 14 and a short-term gain calculation section 60 that calculates short-term gain used in the short-term gain reflection section 30. In the present embodiment, the calculation result of the long-term gain calculation section 50 is used not only in the long-term gain reflection section 14 but also in the short-term gain calculation section 60 for calculation of the short-term gain.

The frequency division section 20 includes an LPF 22, an HPF 24, and a BPF 26. The short-term gain reflection section 30 includes a low-frequency reflection section 32, a high-frequency reflection section 34, and an intermediate-frequency reflection section 36.

In the present embodiment, the LPF 22 outputs a signal of a frequency band of 100 Hz or less to the low-frequency reflection section 32. The HPF 24 outputs a signal of a frequency band of 8000 Hz or more to the high-frequency reflection section 34. The BPF 26 outputs a signal of a frequency band of 100 Hz to 8000 Hz to the intermediate-frequency reflection section 36 as well as to an amplification section 70 to be described later of the short-term gain calculation section 60. The low-frequency reflection section 32, high-frequency reflection section 34, and intermediate-frequency reflection section 36 reflect a change amount of the short-term gain calculated in a short-term gain update section 90 in signals acquired from the LPF 22, HPF 24, and BPF 26 and output the resultant signals to the synthesis section 40.

Although details will be described later, the intermediate-frequency reflection section 36 acquires a change amount of the short-term gain from a first update section 92 of the short-term gain update section 90, and the low-frequency reflection section 32 and high-frequency reflection section 34 acquire a change amount of the short-term gain from a second update section 94 of the short-term gain update section 90. The loudness level of a signal input to the audio signal input section 12 is assumed to be "loudness level 1", the loudness level of a signal that has been subjected to long-term gain adjustment in the long-term gain reflection section 14 is assumed to be "loudness level 2", and the loudness level of a signal that has been subjected to filtering in the intermediate-frequency reflection section 36 is assumed to be "loudness level 3".

Figure 2:
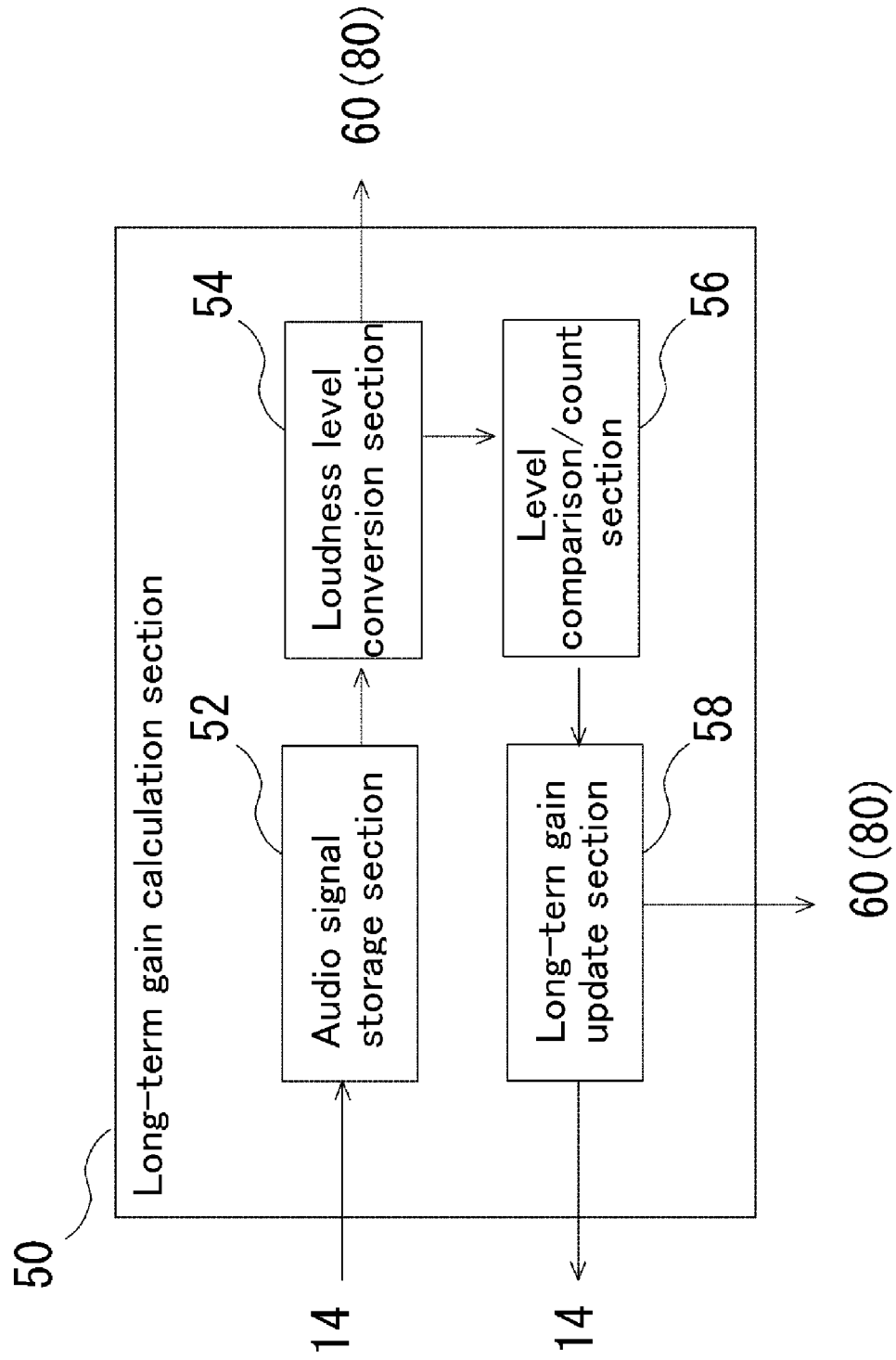
FIG. 2 is a function block diagram of a long-term gain calculation section according to the first embodiment.

FIG. 2 is a function block diagram of the long-term gain calculation section 50 according to the present embodiment. As illustrated, the long-term gain calculation section 50 includes an audio signal storage section 52, a loudness level conversion section 54, a level comparison/count section 56, and a long-term gain update section 58.

The audio signal storage section 52 acquires an output of the long-term gain reflection section 14 and stores it as one frame in a buffer only for a predetermined time period. Here, for example, 10 ms is assumed as the predetermined time.

The loudness level conversion section 54 acquires an audio signal of one frame from the audio signal storage section 52 and calculates the loudness level 2. The loudness level 2 calculated in the loudness level conversion section 54 is output to the level comparison/count section 56 as well as to the short-term gain calculation section 60 of a compression section 80 to be described later.

The level comparison/count section 56 determines where an input level is positioned with respect to the compression threshold value and amplification threshold value on a long-term basis as described above. Specifically, the level comparison/count section 56 has a counter function for long-term gain control and sets the initial value of the counter to "0" and sets the initial value of the long-term gain to "0 dB". Then, the following processing (1) to (4) are executed on a per-frame basis.

(1) Increment counter value by "1" when loudness level 2 that has been subjected to long-term gain adjustment exceeds compression threshold value.

(2) Decrement counter value by "1" when loudness level 2 that has been subjected to long-term gain adjustment falls below amplification threshold value.

(3) Increment or decrement counter value by "1" in direction that long-term gain is set back to initial value if above cases (1) and (2) do not occur.

(4) When counter value reaches preset value after processing of (1) to (3), long-term gain is updated one step larger or smaller, and the counter value is reset to the initial value "0". In this example, when the counter value exceeds "predetermined upper limit threshold value", the long-term gain is decreased by "0.2 dB". When the counter value falls below "predetermined lower limit threshold value", the long-term gain is increased by "0.2 dB". Note that the long-term gain is limited to a range of ±4.0 such that the adjustment range thereof does not become excessively wide. Then, the long-term gain update section 58 notifies the long-term gain reflection section 14 of the value of the long-term gain.

Figure 3:
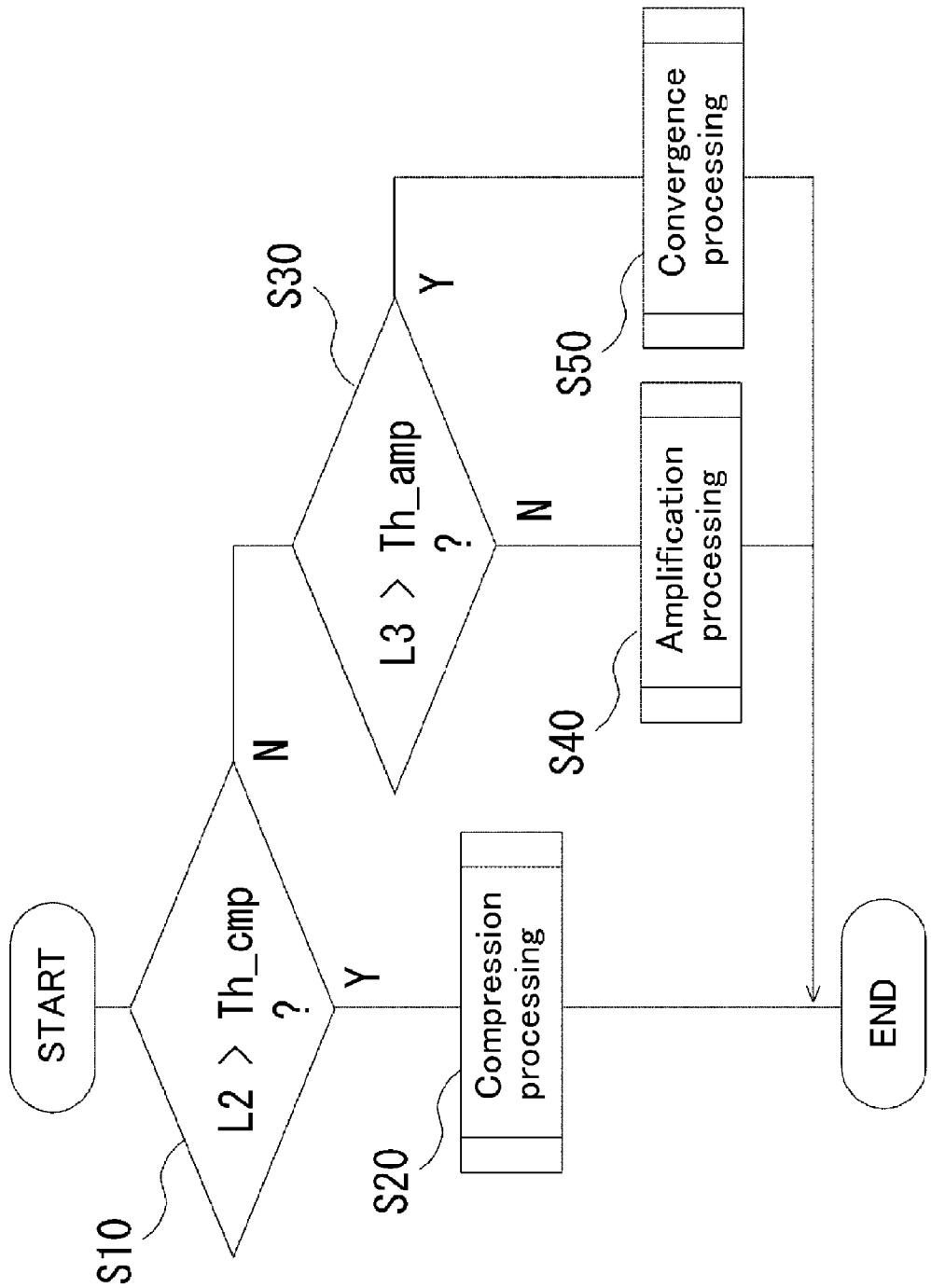
FIG. 3 is a flowchart schematically illustrating a procedure of short-term gain adjustment processing performed in the audio gain adjustment device according to the first embodiment.
Figure 5:
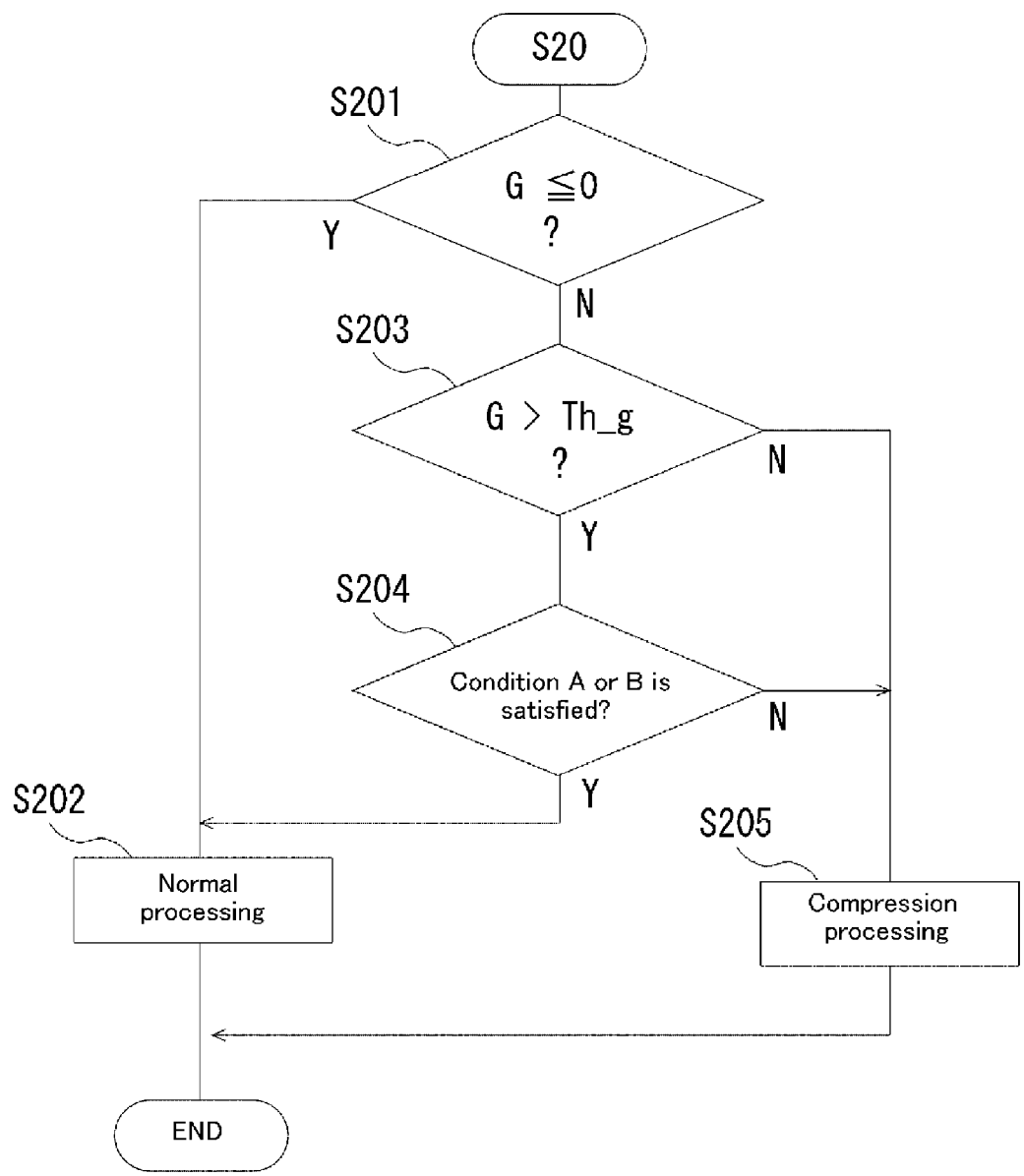
FIG. 5 is a flowchart illustrating processing performed in a compression section of the short-term gain calculation section according to the first embodiment.
Figure 6:
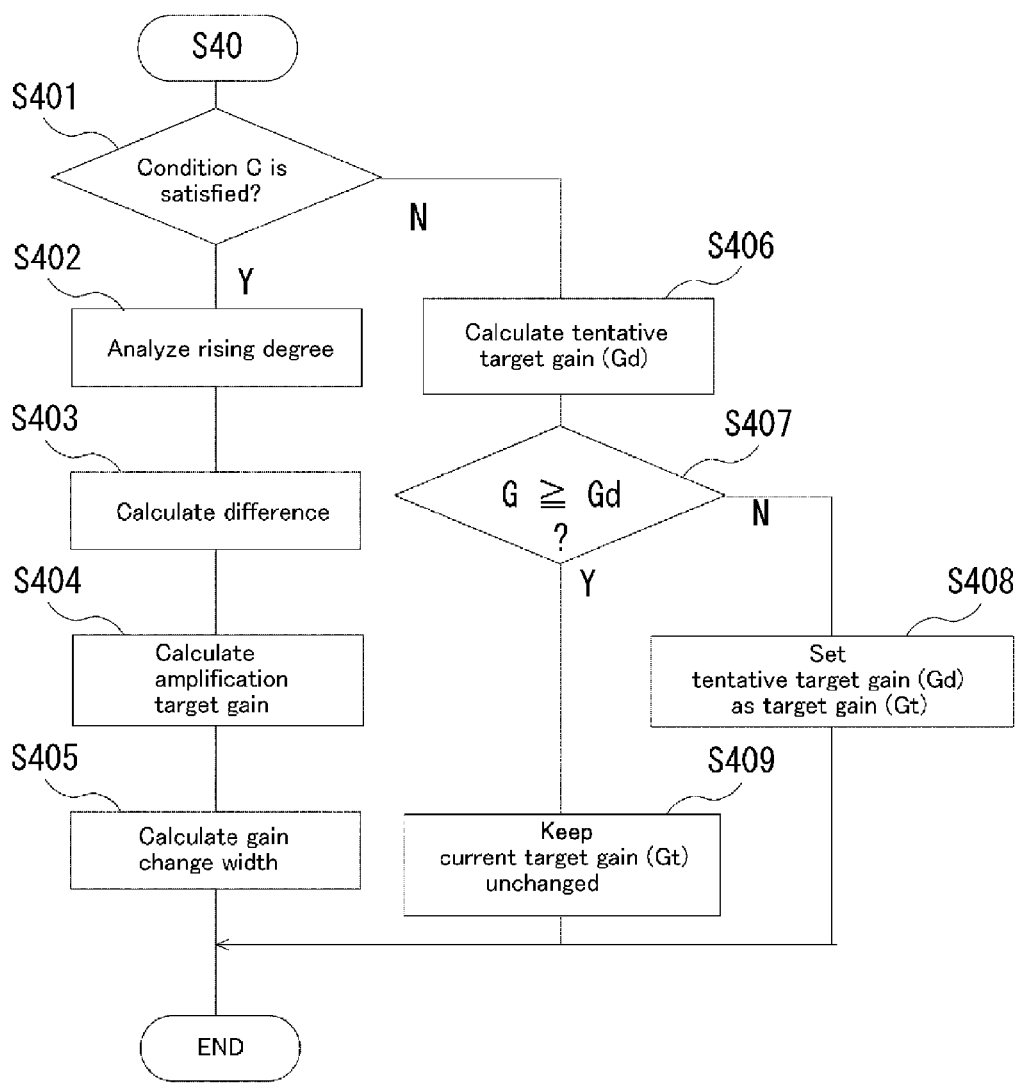
FIG. 6 is a flowchart illustrating processing performed in an amplification section of the short-term gain calculation section according to the first embodiment.

Next, short-term gain adjustment processing will be described. FIG. 3 is a flowchart schematically illustrating a procedure of the short-term gain adjustment processing. In the short-term gain adjustment processing, the loudness level 2 and loudness level 3 are used to determine a control amount. In FIG. 3 and FIGS. 5 and 6 to be described later, the signal, threshold value, and gain are expressed as follows.

Loudness level 1 to 3: L1 to L3
Compression threshold value: Th_cmp
Amplification threshold value: Th_amp
Gain: G
Target gain: Gt
Tentative target gain: Gd First, the loudness level 2 is compared to the compression threshold value (S10). When the loudness level 2 exceeds the compression threshold value (Y in S10), compression processing is performed (S20). When the loudness level 2 does not exceed the compression threshold value (N in S10), the loudness level 3 is compared to the amplification threshold value (S30). When the loudness level 3 is not higher than the amplification threshold value (N in S30), amplification processing is performed (S40). When the loudness level 3 is higher than the amplification threshold value (Y in S30), convergence processing is performed (S50). The convergence processing is processing for making the gain converge to "1".

Although details of the processing will be described later in FIGS. 5 and 6, by performing the processing steps described in the above flow, it is possible to suppress a change in the volume when the sound level abruptly increases at the time of switching from one program to another, from one content to another, or from one scene to another, or at the time when explosion sound occurs, etc., in one scene of the program by the function of controlling the input level on a short-term basis. Further, in the case where the level of the audio band (frequency band output after being filtered in the BPF 26) is small, the output band is raised to make conversation easier to hear. The short-term gain requires quicker gain adjustment than the long-term gain does, so that control exerting great influence on the naturalness of auditory sense is made. As a pattern in which a listener is likely to feel a fluctuation in the sound level, a situation where the gain changes when an audio signal is in a steady state can be taken. In the present embodiment, the steady state of an audio signal is analyzed, and control is performed so as to prevent the gain from abruptly changing in the steady state.

Figure 4:
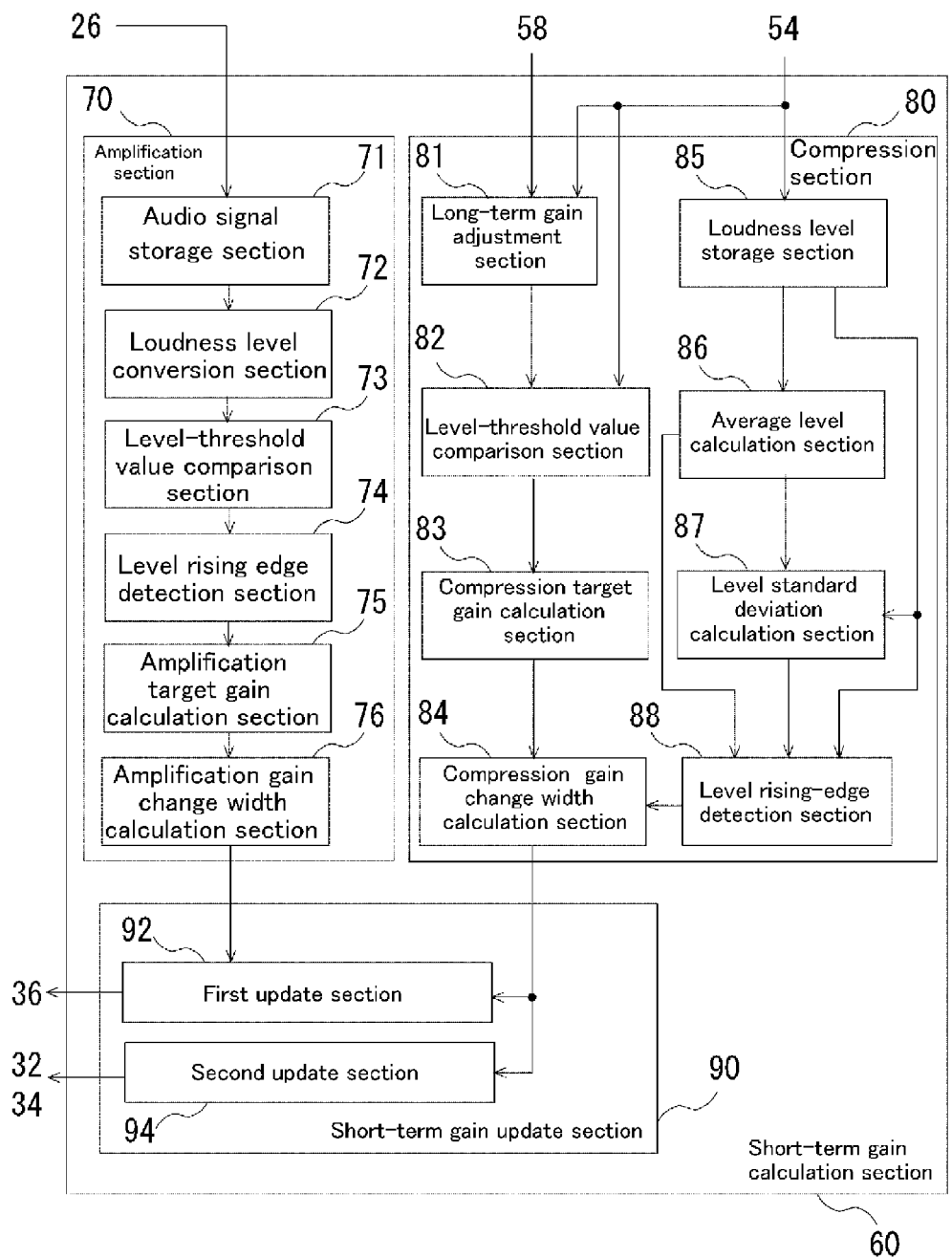
FIG. 4 is a function block diagram of a short-term gain calculation section according to the first embodiment.

FIG. 4 is a function block diagram illustrating in detail the short-term gain calculation section 60. The short-term gain calculation section 60 includes an amplification section 70 that determines a gain adjustment amount used in adjusting the gain so as to make mainly human conversation easy to hear, a compression section 80 that compresses the entire signal level and determines a gain adjustment amount used in adjusting the gain when the sound level abruptly increases, a short-term gain update section 90 that reflects the determined adjustment amounts in a signal. The short-term gain update section 90 includes a first update section 92 that reflects the processing results of the amplification section 70 and compression section 80 in the intermediate-frequency reflection section 36 and a second update section 94 that reflects the processing result of the compression section 80 in both the low-frequency reflection section 32 and high-frequency reflection section 34.

The compression section 80 includes a long-term gain adjustment section 81, a level-threshold value comparison section 82, a compression target gain calculation section 83, a compression gain change width calculation section 84, a loudness level storage section 85, an average level calculation section 86, a level standard deviation calculation section 87, and a level rising-edge detection section 88.

FIG. 5 is a flowchart illustrating processing performed mainly in the compression section 80. The compression processing performed in the compression section 80 will be described according to the flowchart of FIG. 5, followed by a description of components corresponding to respective steps.

In the compression processing, it is determined whether the gain is higher than a predetermined value (in this case, "0 dB") (S201). When the gain is not higher than "0 dB" (Y in S201), it is determined that amplification is not being performed. In this case, as normal processing, a change width of the gain is calculated for each sample from the current gain and compression target gain based on preset attack time and release time (S202).

When the gain is higher than "0 dB" (N in S201), it is determined whether the gain is higher than "predetermined threshold value Th_g" (S203). When the current gain is higher than "predetermined threshold value Th_g" (Y in S203), it is determined that amplification is excessive, and the current gain is updated with the amplification gain upper limit value. However, there is a possibility that a rapid reduction of the gain during the amplification may result in unnatural auditory sense. Thus, the rapid compression processing is performed in the normal processing of S202 only when the following conditions (S204) are satisfied. Specifically, the rapid compression processing is performed when the following conditions (1) to (3) (collectively referred to as "condition A") are satisfied simultaneously or when the following condition (4) (condition B) is satisfied (Y in S204). Here, the attack time is set to, e.g., 1.0 ms.

Condition A:
(1) Gain is 10 dB or more higher than compression threshold value;
(2) Current loudness level 2 is a first predetermined value (e.g., about several dB) higher than peak value of immediately previous loudness level 2;
(3) Difference between average value and current loudness level 2 is a second predetermined value (e.g., about several dB) higher than predetermined multiple (m×σ) of standard deviation σ;

Condition B:
(4) Difference between average value and current loudness level 2 is a third predetermined value (which is larger than second predetermined value) higher than predetermined multiple (m×σ) of standard deviation σ.

When the condition A or condition B is satisfied, level-threshold comparison processing of determining whether the loudness level 1 exceeds the compression threshold is made. Then, when it is determined that the loudness level 1 exceeds the compression threshold, the compression target gain is re-calculated from a difference between the amplification threshold value and current loudness level.

When the gain is lower than "predetermined threshold Th_g" in step S203 (N in S203), or when the condition A or condition B is not satisfied in S204 (N in S204), compression processing of a lower speed than in the normal processing is set (S205). Here, the attack time is set to, e.g., 100 ms.

Next, a configuration of the compression section 80 for executing the above compression processing will be described.

The loudness level storage section 85 stores a certain number of the loudness levels 2 acquired from the loudness level conversion section 54. In this example, for example, 40 (500 ms) loudness levels 2 are stored.

The average level calculation section 86 calculates the average value of the loudness levels 2 stored in the loudness level storage section 85.

Subsequently, the level standard deviation calculation section 87 calculates a standard deviation σ from the loudness levels 2 stored in the loudness level storage section 85 and average value of the loudness calculated in the average level calculation section 86.

The level rising-edge detection section 88 analyzes the rising degree of the loudness level 2. Specifically, the level rising-edge detection section 88 determines whether the condition A or condition B is satisfied.

The long-term gain adjustment section 81 acquires a value of the long-term gain from the long-term gain update section 58 of the long-term gain calculation section 50, reflects the inverse characteristics of the value in the loudness level acquired from the loudness level conversion section 54, calculates the loudness level 1 of the original signal, and outputs the calculated loudness level 1 to the level-threshold value comparison section 82.

The level-threshold value comparison section 82 executes the level-threshold value comparison processing of comparing the loudness level 2 acquired from the loudness level conversion section 54 and loudness level 1 acquired from the long-term gain adjustment section 81.

Then, as described above, the compression target gain calculation section 83 receives a result of the level-threshold value comparison processing and re-calculates the compression target gain from a difference between the compression threshold value and current loudness level as needed.

The compression gain change width calculation section 84 calculates a gain change amount for each sample from a difference between the current gain and compression target gain based on results of the processing performed in the compression target gain calculation section 83 and level rising-edge detection section 88 and notifies the short-term gain update section 90 of the calculated gain change amount.

Next, the amplification processing and amplification section 70 in S40 will be described. The amplification section 70 includes an audio signal storage section 71, a loudness level conversion section 72, a level-threshold value comparison section 73, a level rising-edge detection section 74, an amplification target gain calculation section 75, and an amplification gain change width calculation section 76.

FIG. 6 is a flowchart mainly illustrating processing performed in the amplification section 70. The amplification processing will be described below with the flowchart of FIG. 6 and the components of the amplification section 70 and amplification section 70 illustrated in FIG. 4 associated to one another.

The audio signal storage section 71 acquires an output of the BPF 26 and stores it as one frame in a buffer only for a predetermined time period. Here, for example, as in the audio signal storage section 52 of the long-term gain calculation section 50, 12.5 ms is assumed as the predetermined time.

The loudness level conversion section 72 calculates a loudness level for each frame.

The level-threshold value comparison section 73 determines whether the loudness level calculated for each frame falls between the amplification threshold value and lower limit threshold value. That is, the level-threshold value comparison section 73 determines whether the loudness level falls below the amplification threshold value and exceeds the lower limit threshold value. Here, the lower limit threshold value is set for ignoring noise.

The level rising-edge detection section 74 analyses the rising degree of the loudness level. The level rising-edge detection section 74 analyzes the loudness level of the signal acquired from the BPF 26, i.e., signal of a frequency band of human voice. Then, when all the following conditions (1) to (4) (collectively referred to as "condition C") are satisfied (Y in S401), the level rising-edge detection section 74 sets an amplification target gain.

Condition C:
(1) Current gain is not lower than 0.9;
(2) Two successive loudness levels 3 are increased;
(3) Value of successive increase of (2) is not less than predetermined value; and
(4) Start value of successive increase of (2) is not less than lower limit threshold value.

The amplification target gain calculation section 75 calculates the rising degree (S402), calculates a difference from the amplification threshold value (S403), and determines the amplification target gain based on these values and amplification gain upper limit value (S404).

After that, the amplification target gain calculation section 75 calculates a gain change amount for each sample from the current gain and amplification target gain and notifies the short-term gain update section 90 of the calculated gain change amount (S405).

When the condition C is not satisfied in S401 (N in S401), the amplification target gain calculation section 75 calculates a tentative target gain simply from the difference between an amplification threshold value and loudness level 3 (S406) and compares the tentative target gain and current target gain (S407).

When the tentative target gain is lower than the current target gain (N in S407), the amplification target gain calculation section 75 sets the calculated tentative target gain as the target gain (S408). When the tentative target gain is not lower than the current target gain (Y in S407), the amplification target gain calculation section 75 keeps the current target gain unchanged (S409).

Then, the first update section 92 of the short-term gain update section 90 calculates the gain for each sample such that the gain changes in the direction toward the compression target gain or amplification target gain. The first update section 92 notifies the intermediate-frequency reflection section 36 of the calculated gain and the intermediate-frequency reflection section 36 adjusts the gain of a signal according to the notified gain. Similarly, the second update section 94 calculates the gain for each sample such that the gain changes in the direction toward the compression target gain. The second update section 94 notifies the low-frequency reflection section 32 and high-frequency reflection section 34 of the calculated gain and the low-frequency reflection section 32 and high-frequency reflection section 34 each adjust the gain of a signal according to the notified gain.

Here, the outline of calculation processing of the short-term gain will be described. The gain is calculated also based on the loudness level 2 and loudness level 3. At the time point when the target gain is calculated, the short-term gain at that time is converted into the previous gain, and the current gain is multiplied by "1". Then, the current gain is made to vary. Thus, the short-term gain is expressed by a product of the previous gain and current gain.

A procedure of calculating the short-term gain in the case where the compression processing of S20 has been performed, that is, in the case where the loudness level 2 is higher than the compression threshold value will be described.

(1) When a product of the previous gain and current gain is higher than the compression gain target, the gain is reduced.

(2) When a product of the previous gain and current gain is not higher than the compression gain target, a difference between the previous gain and current gain and gain change width are compared. When the difference is not more than the gain change width, a product of the previous gain and current gain is replaced by the compression gain target. When the difference is more than the gain change width, the current gain is increased by the gain change width.

A procedure of calculating the short-term gain in the case where the amplification processing of S40 has been performed, that is, in the case where the loudness level 3 is higher than the amplification threshold value will be described.

(1) When a product of the previous gain and current gain is not higher than the amplification target gain, the current gain is increased by the calculated change width.

(2) When a product of the previous gain and current gain is higher than the amplification target gain, a difference between the previous gain and current gain are compared. When the difference is not more than the gain change width calculated in S405, a product of the previous gain and current gain is replaced by the compression target gain. When the difference is more than the gain change width, the current gain is reduced by the change width.

When the convergence processing of S50 is performed, the current gain is made to vary such that a product of the previous gain and current gain comes close to "1". When the product of the previous gain and current gain is more than "1", the current gain is reduced. When the product of the previous gain and current gain falls below "1" after further reduction of the current gain, the current gain is adjusted such that the product of the previous gain and current gain becomes "1". When the product of the previous gain and current gain is not more than "1", the current gain is increased. When the product of the previous gain and current gain exceeds "1" after increase of the current gain, the current gain is adjusted such that the product of the previous gain and current gain becomes "1".

Figure 7:
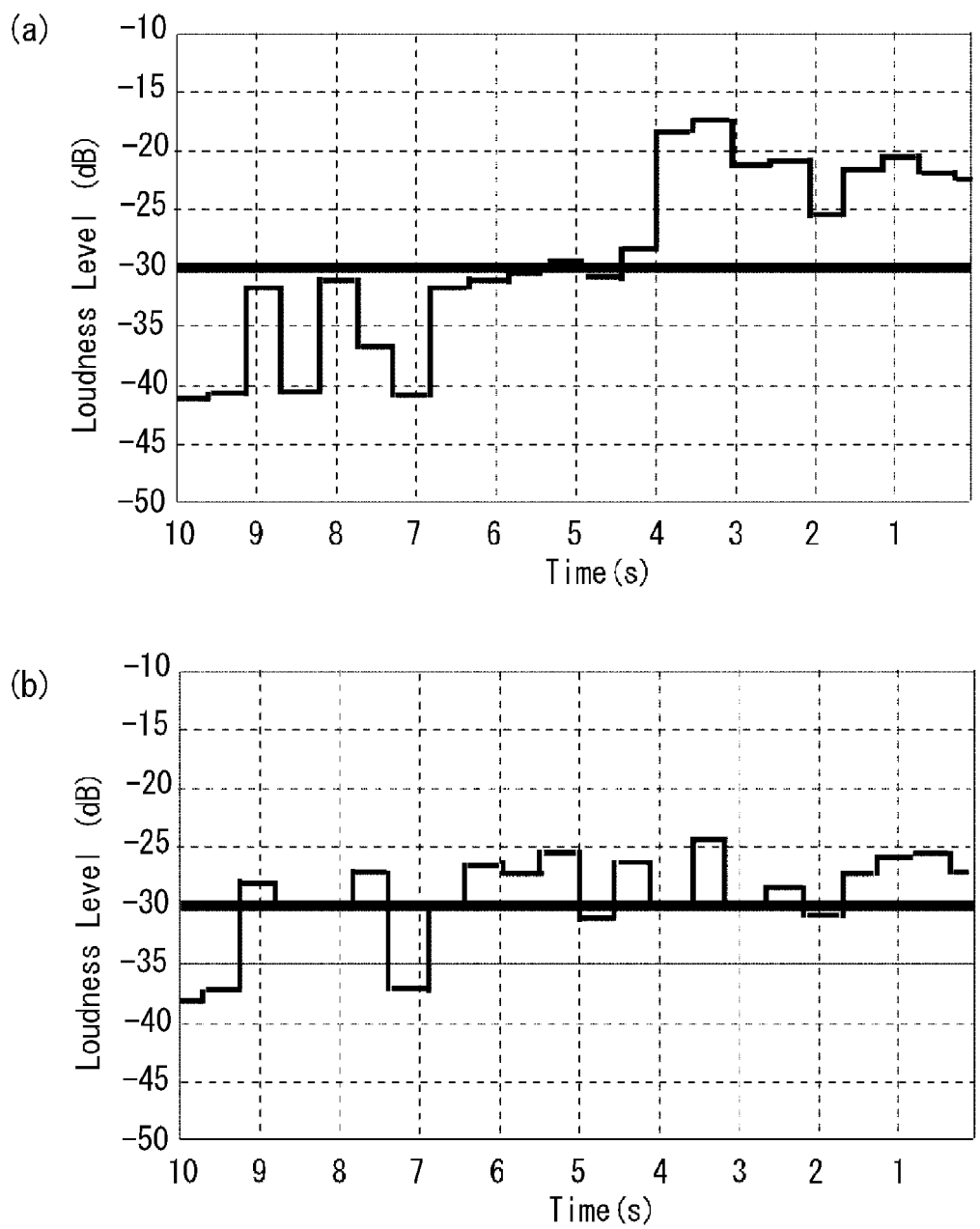
FIGS. 7(*a*) and 7(*b*) are graphs each illustrating an experiment result of automatic gain adjustment processing performed by the audio gain adjustment device according to the first embodiment.

FIGS. 7(a) and 7(b) illustrate a condition in which a result of the automatic gain adjustment processing performed in the above configuration and according to the above processing flow is not applied (FIG. 7(a)) and a condition in which the result of the automatic gain adjustment processing is applied (FIG. 7(b)). As is clear from FIGS. 7(a) and 7(b), a change in the volume level is smaller in FIG. 7(b) than in FIG. 7(a).

As described above, according to the automatic gain adjustment processing of the present embodiment, it is possible to allow adjustment of sound to an ear-friendly level while ensuring a dynamic range intended by a producer of contents to some extent. This alleviates user's time and energy in operating volume control.

The present invention has been described based on the above embodiment. It should be understood by those skilled in the art that the above embodiment is merely exemplary of the invention, various modifications may be made to the components and combinations thereof, and all such variations may be included within the scope of the present invention.

For example, the short-term gain reflection section 30 may include only the intermediate-frequency reflection section 36 so as to allow only a signal of a frequency band of human voice to be controlled. In this configuration, the effect is reduced as compared to the configuration including the low-frequency reflection section 32 and high-frequency reflection section 34, while a reduction in the processing load is achieved.

Further, a configuration may be adopted in which the result of the short-term gain calculation section 60 is reflected in the processing in the long-term gain calculation section. For example, in the case where the volume level is increased as a whole due to sudden switching from one scene to another during an increase in the long-term gain, the short-term gain is significantly reduced. At this time, a fluctuation in the change of the short-term gain is likely to occur. In order to cope with this, when it is determined that the long-term gain is being increased, the reduction speed of the long-term gain may be increased temporarily after the significant reduction in the short-term gain. This allows the fluctuation to be reduced. Further, the BPF 26 and intermediate-frequency reflection section 36 may be each divided into a plurality of blocks.

Figure 8:
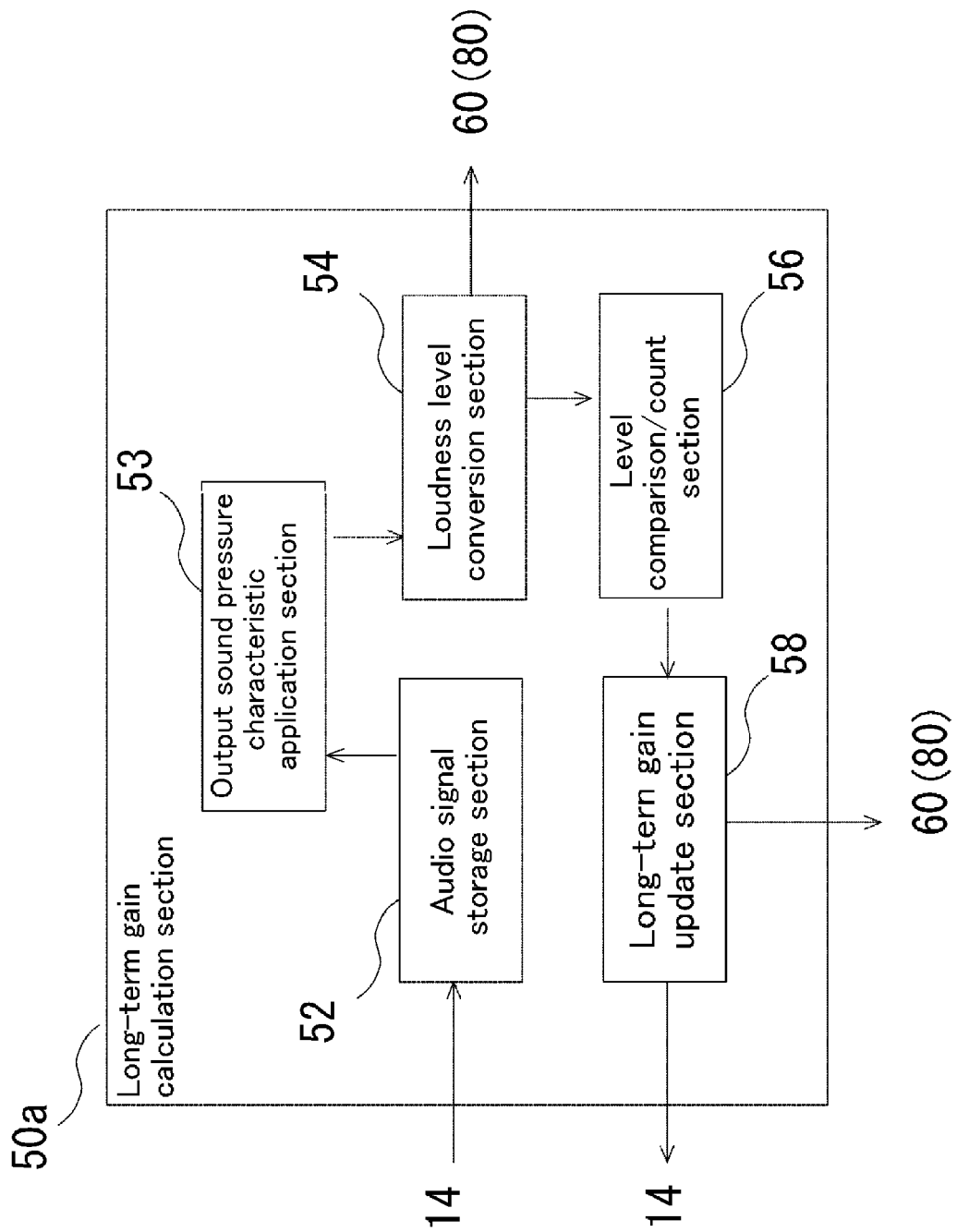
FIG. 8 is a function block diagrams of the long-term gain calculation section of the audio gain adjustment device according to a modification of the first embodiment.
Figure 9:
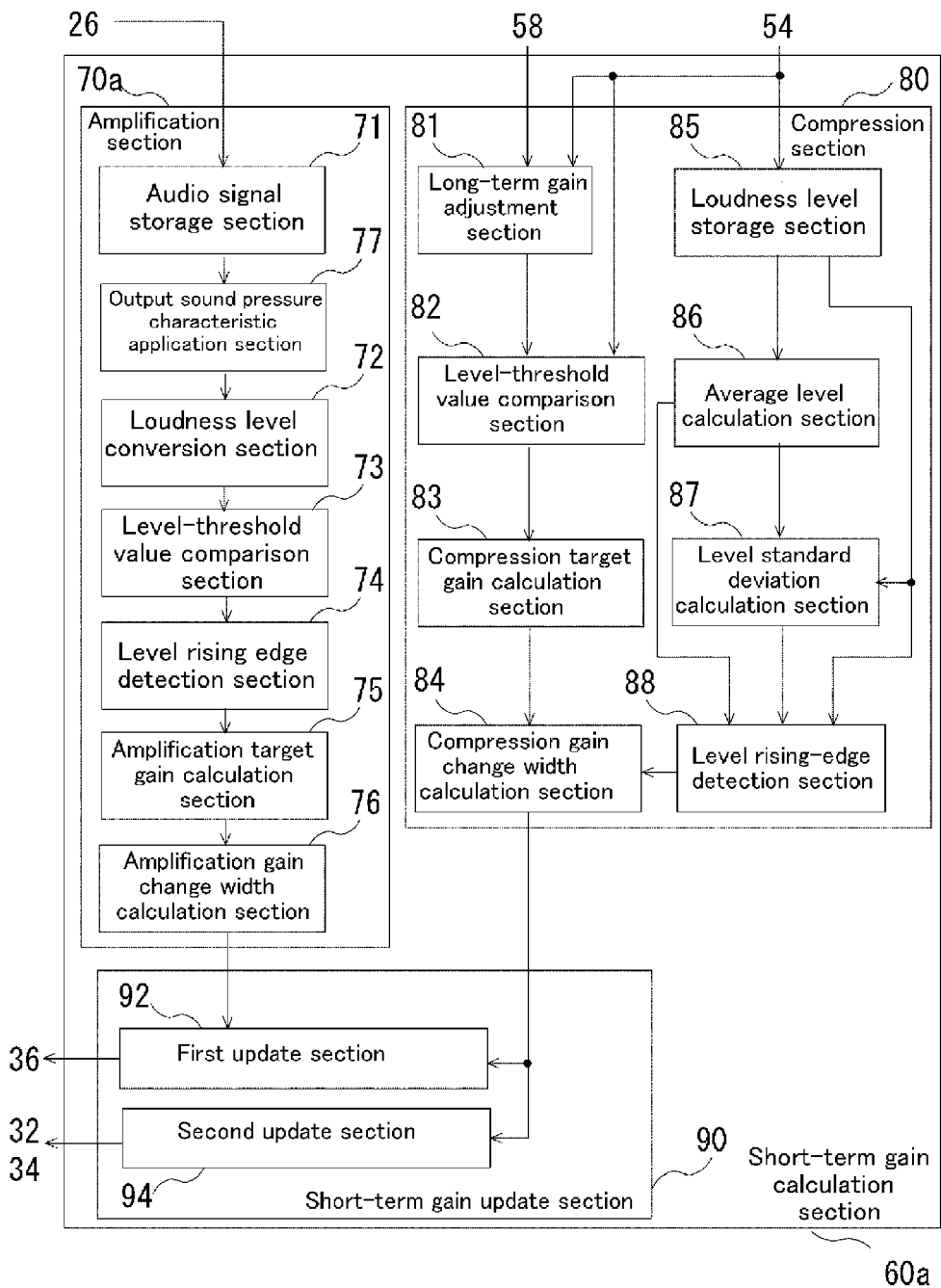
FIG. 9 is a function block diagrams of the short-term gain calculation section of the audio gain adjustment device according to the modification of the first embodiment.

FIGS. 8 and 9 illustrate function block diagrams of a long-term gain calculation section 50a and a short-term gain calculation section 60a of the audio gain adjustment device 10 according to a modification. In the aforementioned embodiment, the automatic gain adjustment is made based on the loudness characteristics reflecting human auditory sense. On the other hand, in the present modification, characteristics of an output means, such as a speaker, are also reflected in the automatic gain adjustment. The audio gain adjustment device 10 according to the modification may have a similar configuration to that of the aforementioned embodiment, so that only different points will be described based on the drawings.

The long-term gain calculation section 50a of the modification includes, between the audio signal storage section 52 and loudness level conversion section 54, an output sound pressure characteristic application section 53 for reflecting characteristics of a speaker or the like in the automatic gain adjustment. Similarly, an amplification section 70a of the short-term gain calculation section 60a includes, between the audio signal storage section 71 and loudness level conversion section 72, an output sound pressure characteristic application section 77 for reflecting characteristics of a speaker or the like in the automatic gain adjustment. This eliminates unnecessary volume control (automatic gain adjustment) caused by the output characteristics of a speaker or the like, thereby enhancing control accuracy.

Second Embodiment

The processing performed in the second embodiment differs from that in the first embodiment in some points.

The first different point is the processing performed in the level comparison/count section 56. Specifically, as in the first embodiment, the level comparison/count section 56 has a counter function for long-term gain control and sets the initial value of the counter to "0" and sets the initial value of the long-term gain to "0 dB". Then, the following processing (1) to (4) are executed. Only the processing of (3) differs from that of the first embodiment.

(1) Increment counter value by "1" when loudness level 2 that has been subjected to long-term gain adjustment exceeds compression threshold value.

(2) Decrement counter value by "1" when loudness level that has been subjected to long-term gain adjustment falls below amplification threshold value.

(3) Count long-term gain in direction going back to initial value when loudness level 2 that has been subjected to long-term gain adjustment falls below lower limit threshold value.

(4) When counter value reaches preset value after processing of (1) to (3), long-term gain is updated one step larger or smaller, and the counter value is reset to the initial value "0". Then, as in the first embodiment, when the counter value exceeds "predetermined upper limit threshold value", the long-term gain is decreased by "0.2 dB". When the counter value falls below "predetermined lower limit threshold value", the long-term gain is increased by "0.2 dB". Note that the long-term gain is limited to a range of ±4.0 such that the adjustment range thereof does not become excessively wide. Then, the long-term gain update section 58 notifies the long-term gain reflection section 14 of the value of the long-term gain.

The second different point is the short-term gain adjustment processing. Specifically, the compression processing (S20) of FIG. 3, that is, the conditions and processing contents in the processing of FIG. 5 differ from those of the first embodiment.

In the compression processing of the second embodiment, it is determined whether the gain is higher than a predetermined value (in this case, "0 dB") (S201). When the gain is not higher than "0 dB" (Y in S201), it is determined that amplification is not being performed. In this case, as normal processing, a change width of the gain is calculated for each sample from the current gain and compression target gain based on preset attack time and release time (S202).

When the gain is higher than "0 dB" (N in S201), the rapid compression processing is performed only when the following conditions (S204) are satisfied. The subsequent processing of S203 is omitted. That is, conditions for performing the compression processing for avoiding generation of unnatural auditory sense due to a rapid reduction of the gain during the amplification are made different. Specifically, the rapid compression processing is performed in the normal processing of S202 when the following conditions (1) and (2) (collectively referred to as "condition A1" which corresponds to condition A of FIG. 5) are satisfied simultaneously or when the following condition (3) (condition B1 which corresponds to condition B of FIG. 5) is satisfied (Y in S204). Here, the attack time is set to, e.g., 1.0 ms. The different point is that (2) of the condition A of the first embodiment is omitted.

Condition A1:
(1) Gain is 10 dB or more higher than compression threshold value;
(2) Difference between average value and current loudness level 2 is a second predetermined value (e.g., about several dB) higher than predetermined multiple (m×σ) of standard deviation σ;

Condition B1:
(3) Difference between average value and current loudness level 2 is a third predetermined value (which is larger than second predetermined value) higher than predetermined multiple (m×σ) of standard deviation σ.

When the condition A1 or condition B1 is satisfied, level-threshold comparison processing of determining whether the loudness level 1 exceeds the compression threshold is made. Then, when it is determined that the loudness level 1 exceeds the compression threshold, the compression target gain is re-calculated from a difference between the compression threshold value and current loudness level.

When the condition A1 or condition B1 is not satisfied in S204 (N in S204), compression processing of a lower speed than in the normal processing is set (S205). Here, the attack time is set to, e.g., 100 ms.

The configuration of the compression section 80 for executing the above compression processing is the same as that of the first embodiment.

The third different point is the content of the amplification processing (S40) of FIG. 3, that is, conditions and processing contents in the processing of FIG. 6 differ from those of the first embodiment.

The level rising-edge detection section 74 analyses the rising degree of the loudness level (S401). The level rising-edge detection section 74 analyzes the loudness level of the signal acquired from the BPF 26, i.e., signal of a frequency band of human voice. Then, when all the following conditions (1) to (4) (collectively referred to as "condition C1" which corresponds to the condition C of FIG. 6) are satisfied (Y in S401), the level rising-edge detection section 74 sets an amplification target gain (S403).

Condition C1:
(1) Current gain is not lower than 0.99;
(2) Two successive loudness levels 3 are increased;
(3) Value of successive increase of (2) is not less than predetermined value; and
(4) Start value of successive increase of (2) is not less than lower limit threshold value.

The amplification target gain calculation section 75 calculates a difference from the amplification threshold value (S403), and determines the amplification target gain based on the difference and amplification gain upper limit value (S404). That is, the processing of S402 of the first embodiment is omitted. For example, when a value obtained by "the above difference×long-term gain" is less than a predetermined maximum amplification value, the difference is set as the amplification target gain. Otherwise, a value obtained by "maximum amplification value/long-term gain" is set as the amplification target gain. Further, as is clear from the above, the value (0.99) in (1) of the condition C1 differs from that (0.9) in (1) of the condition C of the first embodiment.

After that, the amplification target gain calculation section 75 calculates a gain change amount for each sample from the current gain and amplification target gain and notifies the short-term gain update section 90 of the calculated gain change amount (S405).

When the condition C1 is not satisfied in S401 (N in S401), the amplification target gain calculation section 75 calculates a tentative target gain simply from the difference between an amplification threshold value and loudness level 3 (S406) and compares the tentative target gain and current target gain (S407).

When the tentative target gain is lower than the current target gain (N in S407), the amplification target gain calculation section 75 sets the calculated tentative target gain as the target gain (S408). When the tentative target gain is not lower than the current target gain (Y in S407), the amplification target gain calculation section 75 keeps the current target gain unchanged (S409). At this time, the amplification target gain calculation section 75 sets an amplification release time to the length of one frame and re-calculates a change width of the release time, that is, an increase width of the gain for each step.

Then, the first update section 92 of the short-term gain update section 90 calculates the gain for each sample such that the gain changes in the direction toward the compression target gain or amplification target gain. The first update section 92 notifies the intermediate-frequency reflection section 36 of the calculated gain and the intermediate-frequency reflection section 36 adjusts the gain of a signal according to the notified gain. Similarly, the second update section 94 calculates the gain for each sample such that the gain changes in the direction toward the compression target gain. The second update section 92 notifies the low-frequency reflection section 32 and high-frequency reflection section 34 of the calculated gain and the low-frequency reflection section 32 and high-frequency reflection section 34 each adjust the gain of a signal according to the notified gain.

Here, the outline of calculation processing of the short-term gain will be described. The gain is calculated also based on the loudness level 2 and loudness level 3. A product of the previous gain and current gain is used in the first embodiment, while the short-term gain is used in the present embodiment.

A procedure of calculating the short-term gain in the case where the compression processing of S20 of the present embodiment has been performed, that is, in the case where the loudness level 2 is higher than the compression threshold value will be described.

(1) When the short-term gain is higher than the compression gain target, the short-term gain is reduced.
(2) When the short-term gain is not higher than the compression gain target, the short-term gain and gain change width are compared. When a difference between the short-term gain and gain change width is less than the gain change width, the short-term gain is replaced by the compression gain target. Further, when the above difference is more than the gain change width, the short-term gain is increased by the gain change width.

A procedure of calculating the short-term gain in the case where the amplification processing of S40 has been performed, that is, in the case where the loudness level 3 is higher than the amplification threshold value will be described.

(1) When the short-term gain is not higher than the amplification target gain, the short-term gain is increased by the calculated gain change width.
(2) When the short-term gain is higher than the amplification target gain, a difference between the short-term gain and amplification target gain are compared. When the difference is not more than the gain change width calculated in S405, the short-term gain is replaced by the amplification target gain. When the difference is more than the gain change width, the short-term gain is reduced by the gain change width.

When the convergence processing of S50 is performed, the current gain is made to vary such that the short-term gain comes close to "1". When the short-term gain is more than "1", the current gain is reduced. When the short-term gain falls below "1" after further reduction of the current gain, the current gain is adjusted such that the short-term gain becomes "1". When the short-term gain is not more than "1", the current gain is increased. When the short-term gain exceeds "1" after increase of the current gain, the current gain is adjusted such that the short-term gain becomes "1".

As described above, according to the present embodiment, the same effect as in the first embodiment can be obtained.

Third Embodiment

In the present embodiment, volume control at the time of switching from one input source to another or from one scene from another in one source will be described. There may be a case where the volume level abruptly and significantly changes at the time of switching from one input source to another or at the time of switching from one scene to another in one source in a TV set or audio system. In such a case, a viewer feels uncomfortable or gets surprised accordingly, forcing him or her to frequently adjust the volume. In order to solve such a problem, a technique called ALC (Automatic Level Control) or DRC (Dynamic Range Compression) that automatically adjusts a gain has been used. The above techniques simply attenuate a signal at a constant rate with respect to the amount that exceeds a threshold value level set in correspondence with the volume level of an input source.

A human senses the loudness under various influences such as not only the sound pressure level reaching into a listener's ear, but also frequency characteristics and a way to change to the current sound pressure level. For example, assuming that the sound pressure level is the same, sound emerging from silence tends to feel louder. Therefore, the technique that attenuates a signal at a constant rate with respect to an acoustic signal (audio signal) that exceeds a threshold value level may fail to bring about a sufficient effect.

Thus, in the present embodiment, the gain adjustment method is changed depending not only on the momentary volume level but also on a state of the volume level of the immediately previous audio signal. This approach is used to alleviate uncomfortable feeling of a viewer. That is, when the volume of an input signal (acoustic signal or audio signal) exceeds a preset threshold value level, the gain adjustment amount is changed depending on a state of the volume level of the previous audio signal reproduced until the time point before the exceeding of the threshold value. Details will be described below.

Figure 10:
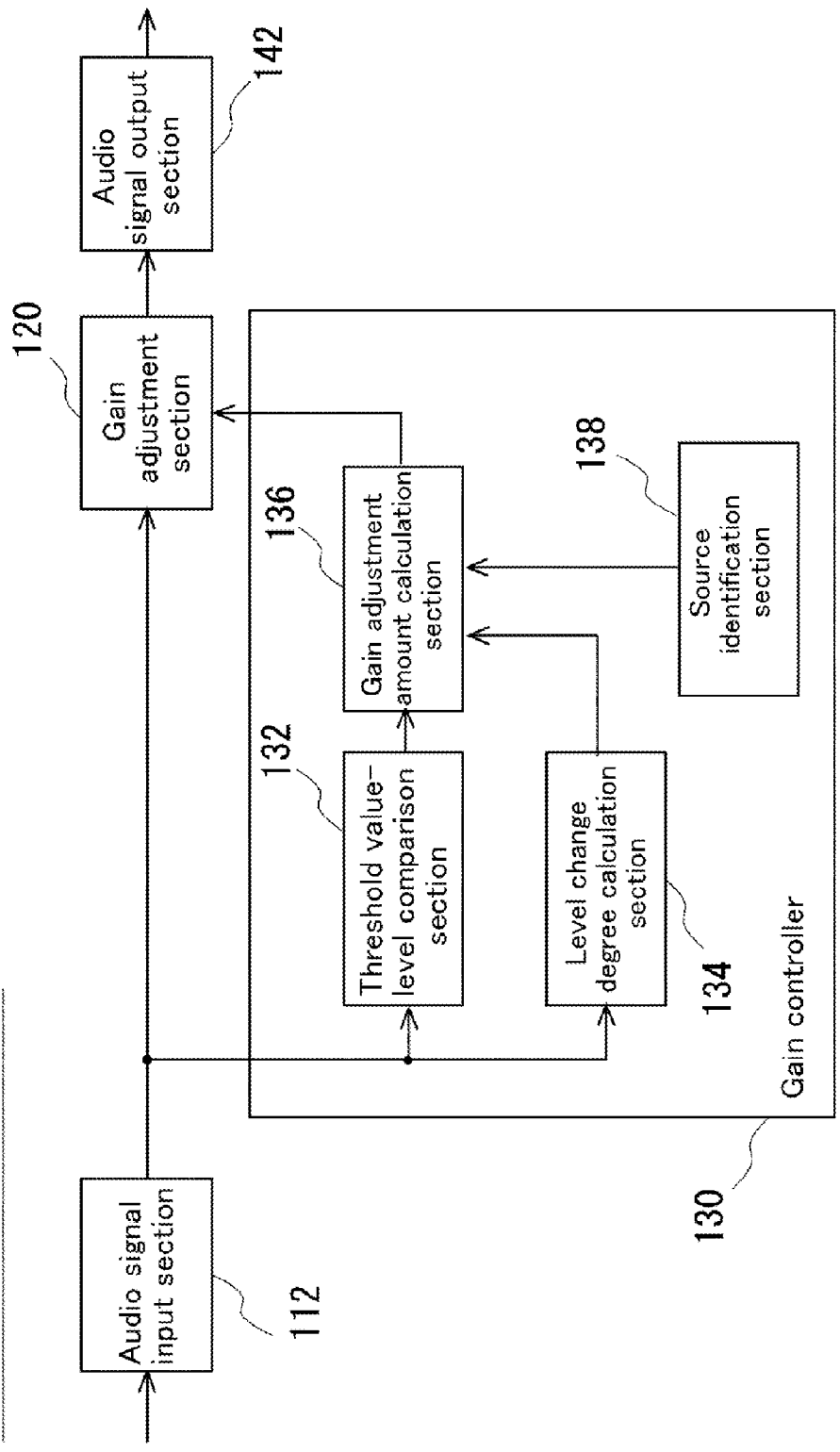
FIG. 10 is a function block diagram schematically illustrating a configuration of the audio gain adjustment device according to a third embodiment.

FIG. 10 is a function block diagram schematically illustrating a configuration of an audio gain adjustment device 110 according to the present embodiment. This audio gain adjustment device 110 is mounted in a TV set or an audio system. As illustrated, the audio gain adjustment device 110 includes an audio signal input section 112, a gain adjustment section 120, a gain controller 130, and an audio signal output section 142.

The audio signal input section 112 has a function similar to the audio signal input section 12 of the first embodiment, and acquires an audio signal to be adjusted. The gain adjustment section 120 applies gain adjustment to an audio signal in accordance with a calculation result of the gain controller 130. The audio signal output section 142 outputs an audio signal that has been subjected to the gain adjustment, like the audio signal output section 42 of the first embodiment.

The gain controller 130 includes a threshold value-level comparison section 132, a level change degree calculation section 134, a gain adjustment amount calculation section 136, and a source identification section 138.

The threshold value-level comparison section 132 compares a level value of an audio signal input thereto from the audio signal input section 112 and a preset threshold value level to calculate a difference level.

The level change degree calculation section 134 compares the level of an audio signal input within a given past time period (e.g., one second) and level of an audio signal currently being input to calculate a level change degree and notifies the gain adjustment amount calculation section 136 of the calculated level change degree. The level of an audio signal within a predetermined time period including the given past time period is stored in the level change degree calculation section 134.

When the difference level calculated in the threshold value-level comparison section 132 is a positive value, that is, when the level value of an audio signal exceeds a preset threshold value, the gain adjustment amount calculation section 136 calculates the compression ratio of the audio signal in accordance with the level change degree calculated in the level change degree calculation section 134 and calculates a gain adjustment amount according to the calculated compression ratio. Specifically, the gain adjustment amount calculation section 136 calculates the gain adjustment amount according to one of the following procedures (1) to (3).

(1) Calculation procedure 1: Calculate compression ratio of audio signal in accordance with level change degree calculated in level change degree calculation section 134 and calculate gain adjustment amount according to calculated compression ratio.

(2) Calculation procedure 2: Calculate threshold value for gain adjustment in accordance with level change degree calculated in level change degree calculation section 134 and calculate gain adjustment amount according to calculated threshold value.

(3) Calculation procedure 3: Calculate threshold value and compression ratio for gain adjustment in accordance with level change degree calculated in level change degree calculation section 134 and calculate gain adjustment amount according to calculated threshold value and compression ratio.

Which one of the above procedures (1) to (3) is used is previously set by a user or set depending on a selected source or reproduced content. The above setting is based on identification by the source identification section 138.

The source identification section 138 identifies the content of an audio signal currently being reproduced. It is assumed here that the audio gain adjustment device 110 is mounted in a digital broadcast TV system. In digital broadcast, program information such as category of content is included in data to be broadcasted, and the program information is utilized as an electronic TV program listing. The source identification section 138 can identify the category of current content based on such program information and determine which one of the above calculation procedures is used for the gain adjustment.

Further, the source identification section 138 can make the above determination when one channel or input source is switched to another. Setting of which one of the above calculation procedures is used under what conditions is previously made and can be selected by a user. For example, in the case of a movie, a signal level often abruptly changes for sound effect or the like. When processing in the gain compression direction is performed in such a case, the original sound effect may fade. In order to cope with this, in the case where the current content is identified as a movie, the gain compression processing is not performed so as to avoid unfavorable result. Alternatively, in the case of a news program, a significant change in the volume is not supposed to occur, so that the compression ratio is set comparatively high, thus preventing uncomfortable feeling due to loud volume coming at the time of switching to a commercial message. Further, a button for temporarily stopping the compression processing may be provided on a remote controller for TV or the like.

The gain adjustment section 120 reflects the gain adjustment amount calculated in the gain adjustment amount calculation section 136 in an audio signal input thereto from the audio signal input section 112 and outputs the resultant signal to the audio signal output section.

Next, the calculation procedures 1 to 3 of the gain adjustment amount performed in the level change degree calculation section 134 will be described.

(1) The following three approaches (a) to (c) are used for the calculation procedure 1. FIGS. 11 to 14 each illustrate a relationship between the level change degree and compression ratio. Although the compression ratio is set infinite (∞) for descriptive purpose in FIGS. 11 to 14, it can arbitrarily be set, of course.

Figure 11:
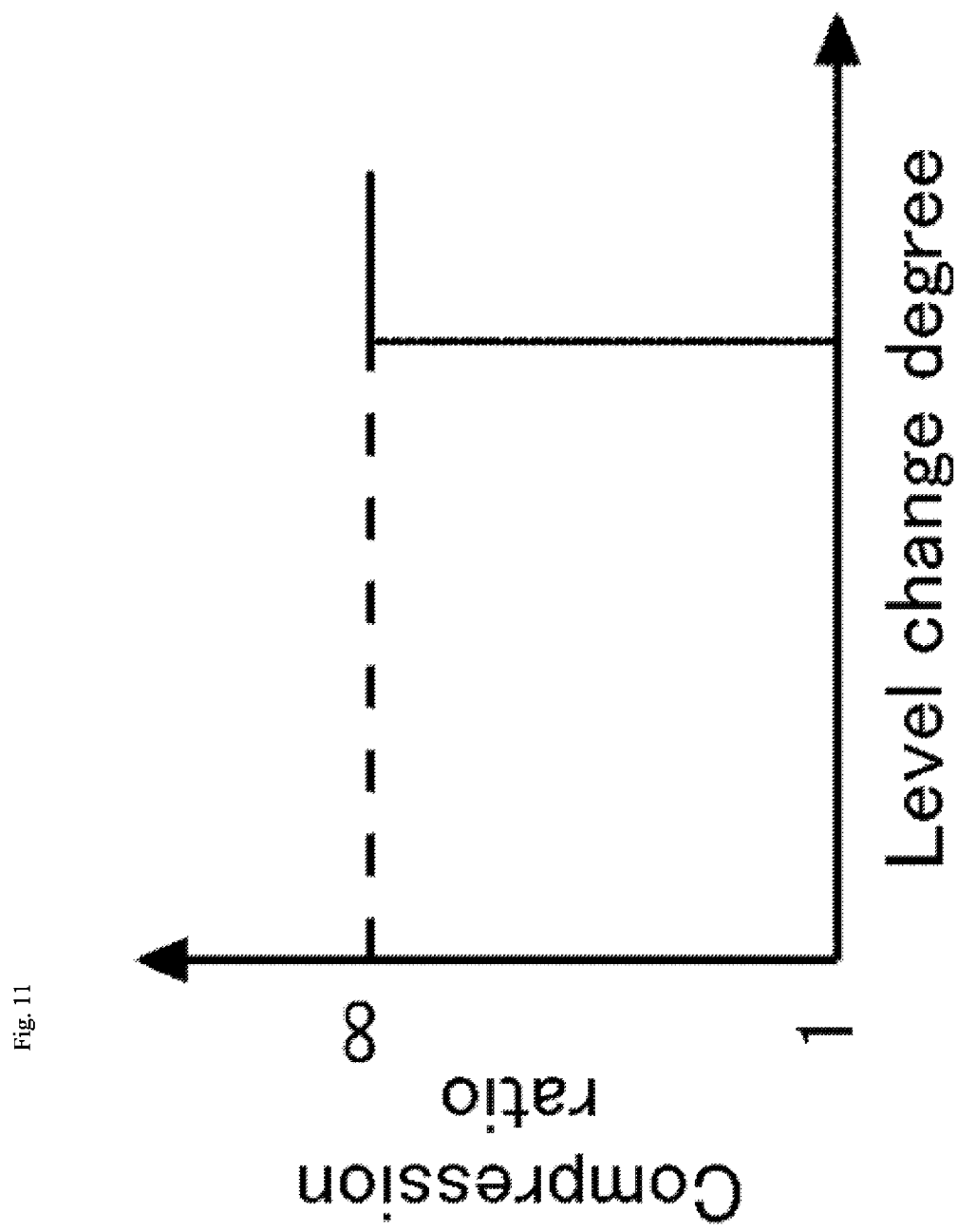
FIG. 11 is a view illustrating a relationship between a level change degree and a compression ratio in (a) of a calculation procedure 1 according to the third embodiment.

(a) As illustrated in FIG. 11, only when the level change degree exceeds a preset value, compression processing is performed, which is the same concept as a limiter. This approach is effective when a loud audio signal abruptly emerges from silence. Specifically, at the time of switching from a given program to a CM (commercial message) during broadcasting, the compression ratio becomes maximum only when CM sound abruptly emerges from silence of one second, thereby alleviating uncomfortable feeling of a viewer with respect to the loud audio signal.

Figure 12:
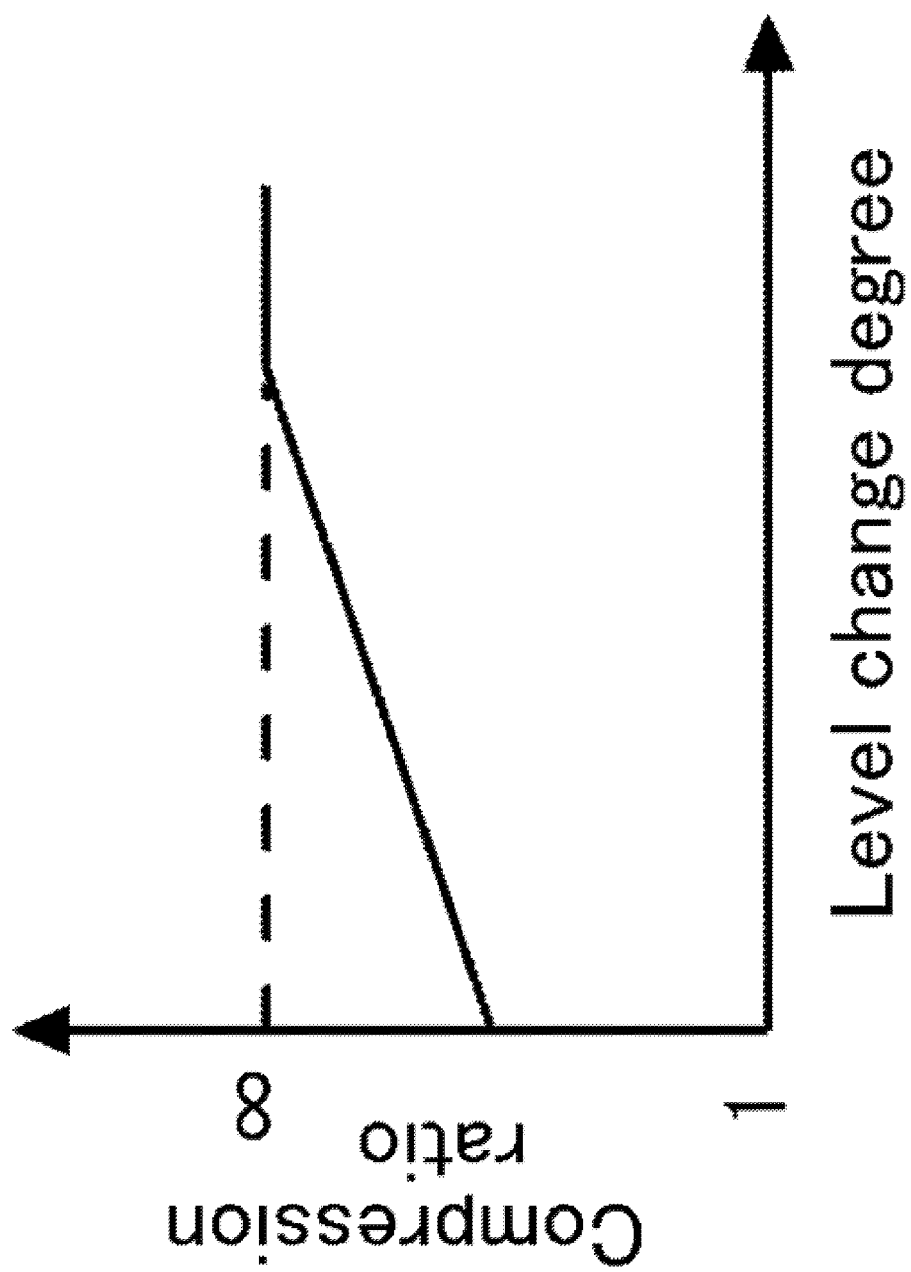
FIG. 12 is a view illustrating a relationship between a level change degree and a compression ratio in (b) of the calculation procedure 1 according to the third embodiment.

(b) As illustrated in FIG. 12, the compression ratio is made to vary in proportion to the level change degree. That is, the higher the level change degree, the higher the compression ratio is made. Not only at the time of switching from a given program to the CM, but also at the time when a scene abruptly switches from a silent scene to a scene where loud sound is generated within a given program or a movie, the compression ratio is increased depending on the sound intensity. As a result, a viewer can enjoy contents more comfortably.

Figure 13:
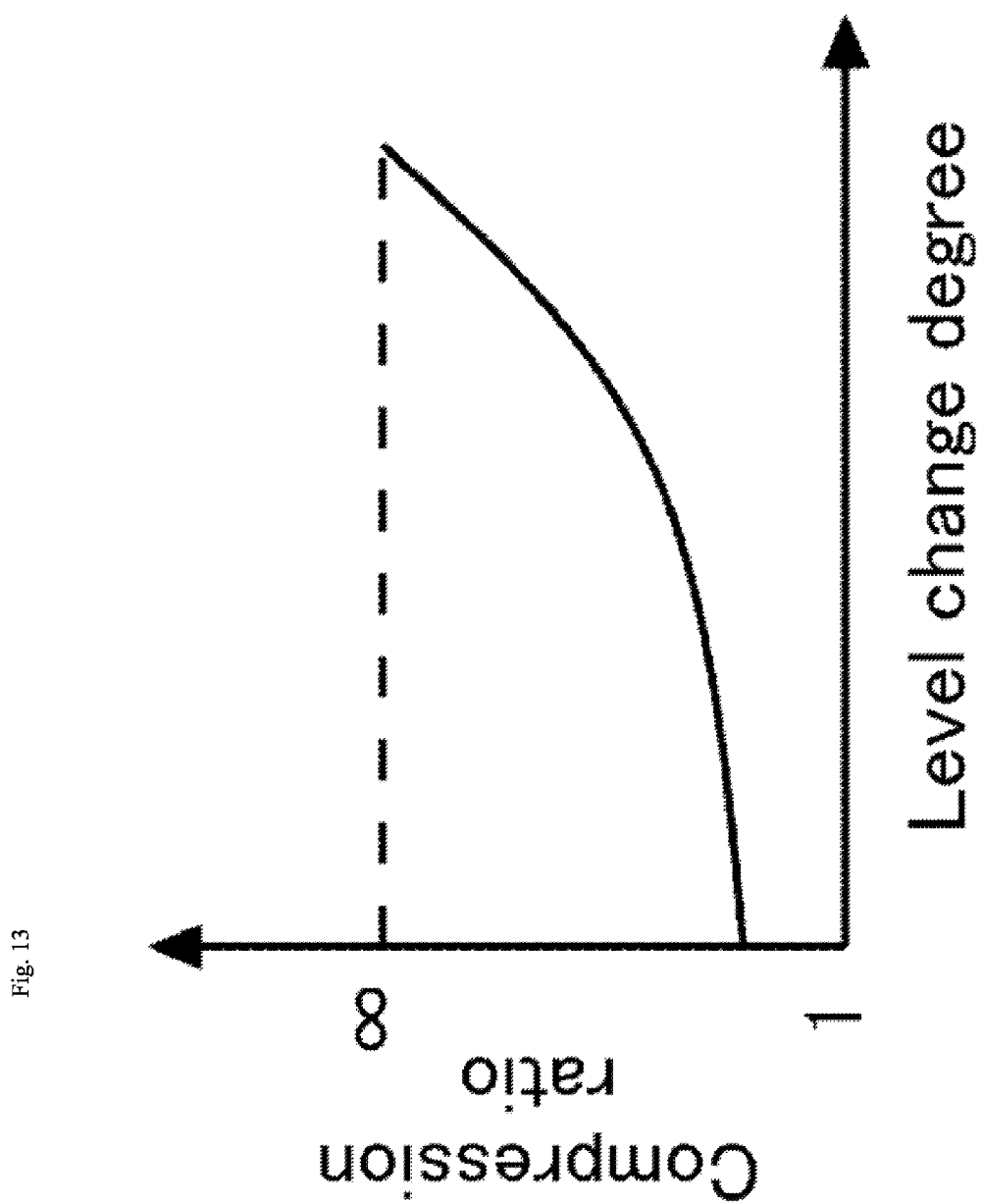
FIG. 13 is a view illustrating a relationship between a level change degree and a compression ratio in (c) of the calculation procedure 1 according to the third embodiment.

(c) As illustrated in FIG. 13, the compression ratio is made to vary exponentially in accordance with the level change degree. In this approach, the compression ratio is set at a low level under normal conditions, and when there is a tendency where loud sound is generated rather abruptly, the compression ratio can be exponentially increased. Thus, it is possible to suppress only the annoying audio signal to a viewer while keeping naturalness in the auditory sense under normal conditions.

Figure 14:
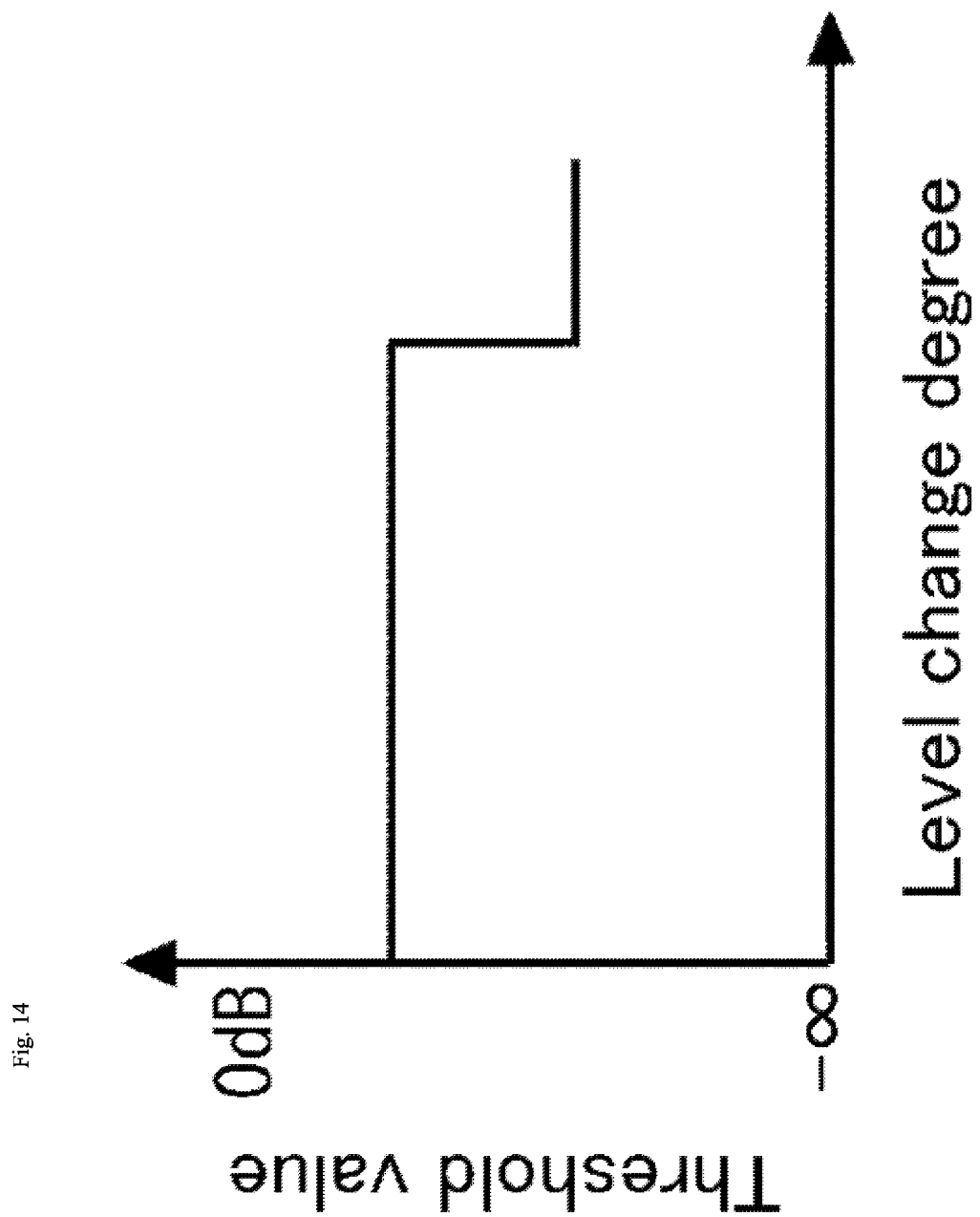
FIG. 14 is a view illustrating a relationship between a level change degree and a threshold value in (a) of a calculation procedure 2 according to the third embodiment.
Figure 15:
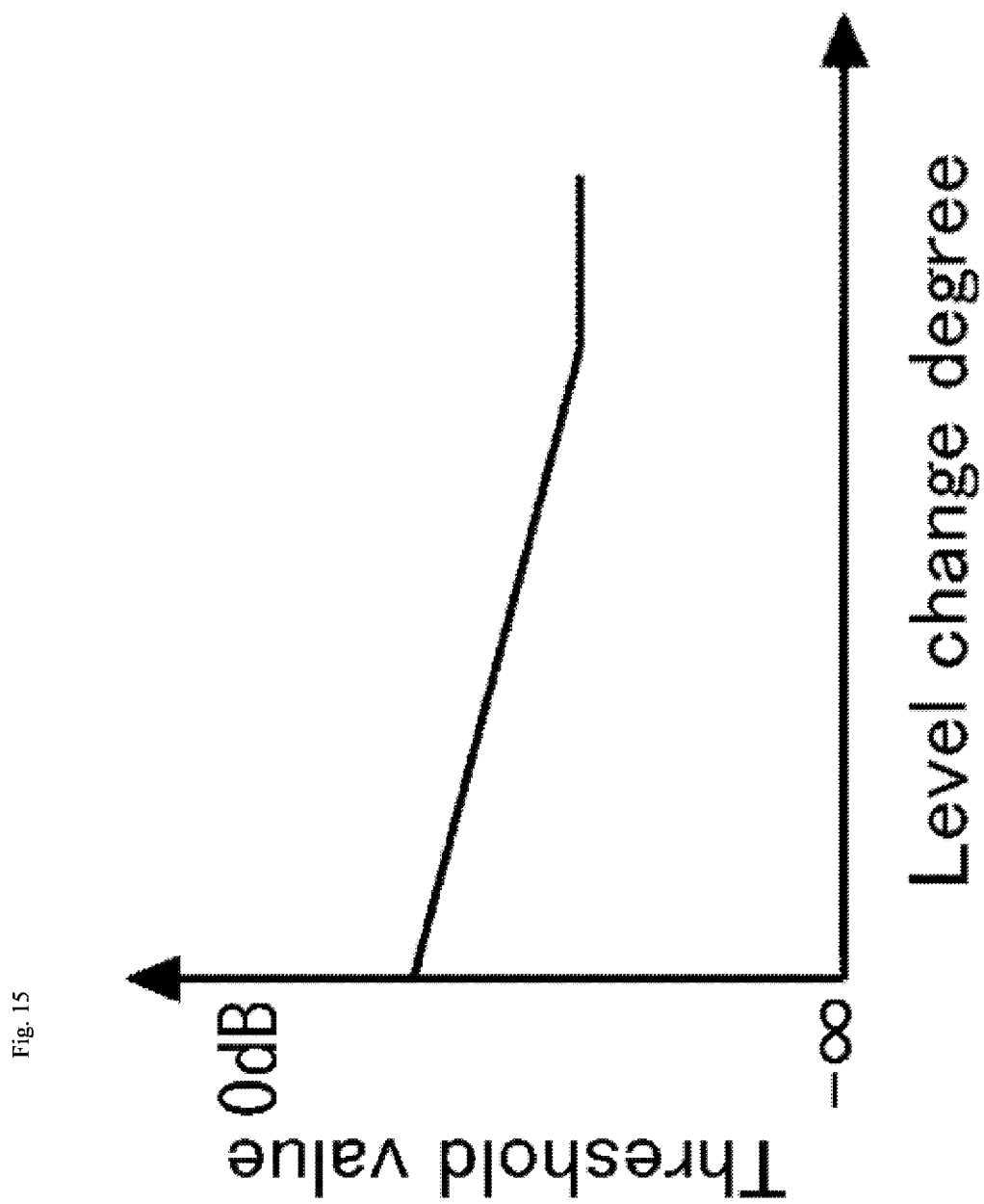
FIG. 15 is a view illustrating a relationship between a level change degree and a threshold value in (b) of the calculation procedure 2 according to the third embodiment.
Figure 16:
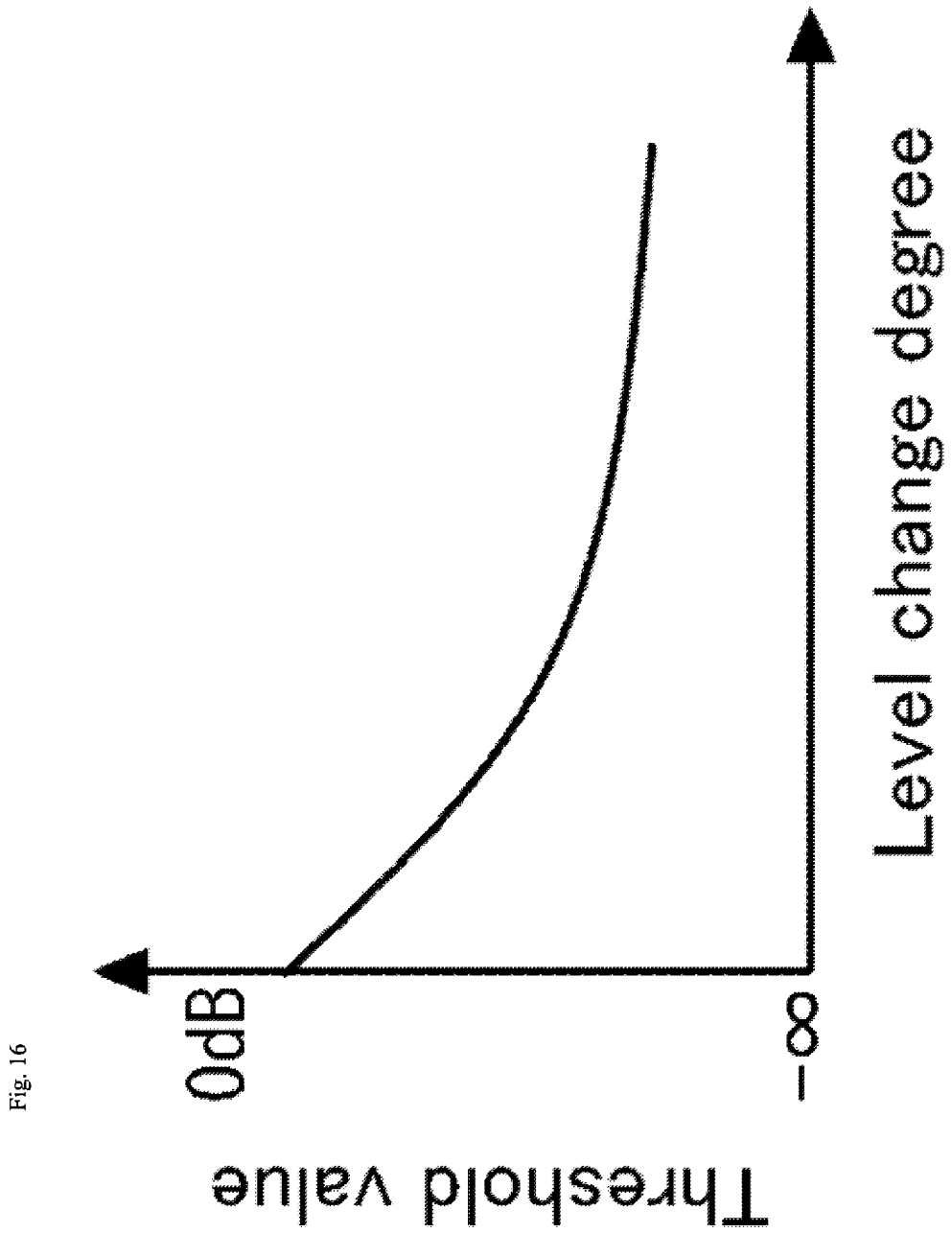
FIG. 16 is a view illustrating a relationship between a level change degree and a threshold value in (c) of the calculation procedure 2 according to the third embodiment.

(2) The following three approaches (a) to (c) are used for the calculation procedure 2. FIGS. 14 to 16 each illustrate a relationship between the level change degree and threshold value.

(a) As illustrated in FIG. 14, only when the level change degree exceeds a preset value, the threshold value is reduced. This approach is effective when a loud audio signal abruptly emerges from silence. Specifically, at the time of switching from a given program to a CM (commercial message) during broadcasting, the threshold value is reduced only when CM sound abruptly emerges from silence of one second, thereby alleviating uncomfortable feeling of a viewer with respect to the loud audio signal.

(b) As illustrated in FIG. 15, the threshold value is made to vary in proportion to the level change degree. That is, the higher the level change degree, the smaller the threshold value is made. Not only at the time of switching from a given program to the CM, but also at the time when a scene abruptly switches from a silent scene to a scene where loud sound is generated within a given program or a movie, the threshold value is reduced depending on the sound intensity. As a result, a viewer can enjoy contents more comfortably.

(c) As illustrated in FIG. 16, the threshold value is made to vary exponentially in accordance with the level change degree. In this approach, the threshold value is set to a large value under normal conditions, and when there is a tendency where loud sound is generated rather abruptly, the compression ratio can be exponentially reduced. Thus, it is possible to suppress only the annoying audio signal to a viewer while keeping naturalness in the auditory sense under normal conditions.

(3) The calculation procedure 3 is a combination of the calculation procedures 1 and 2.

Figure 17:
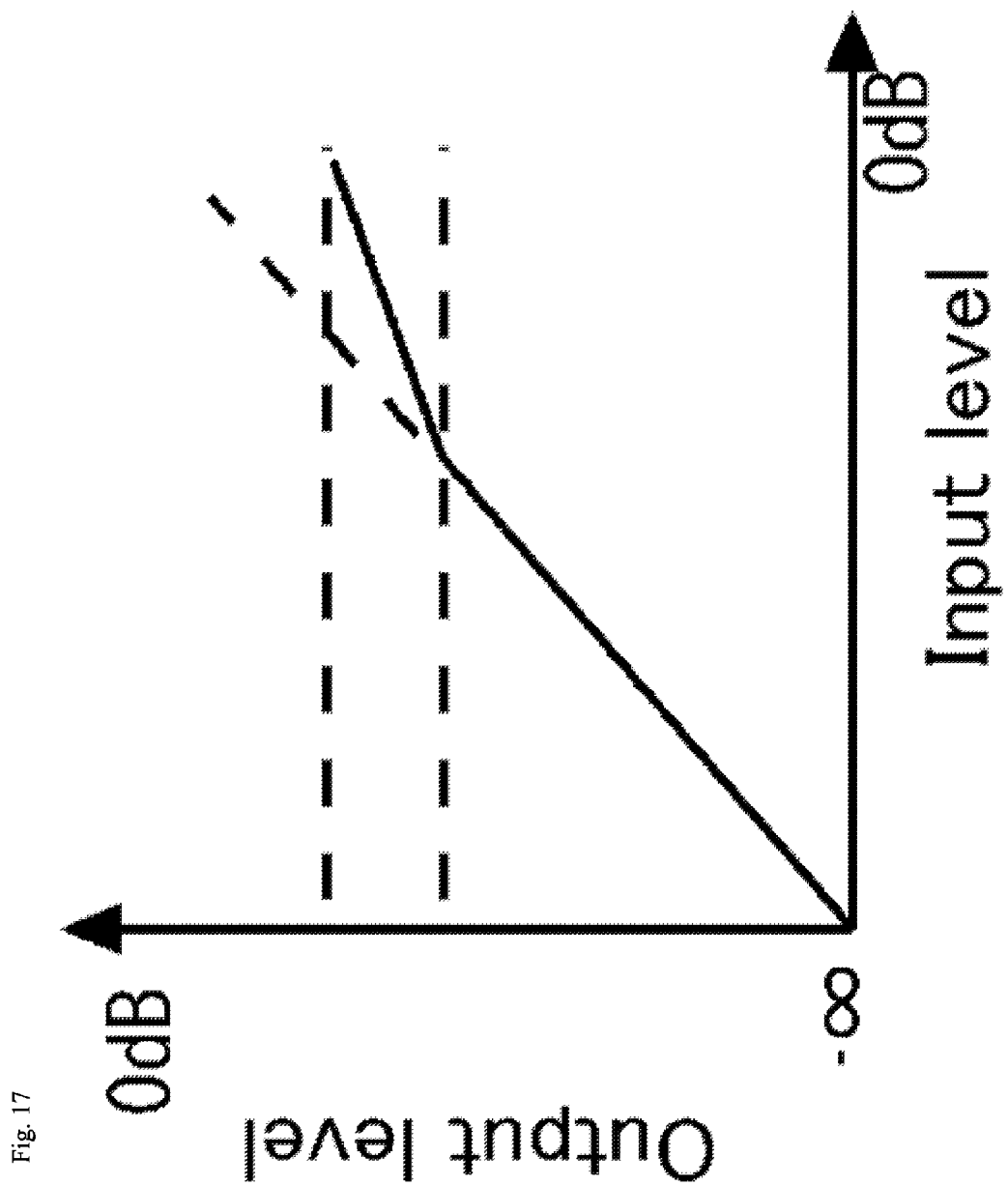
FIG. 17 is a view illustrating a relationship between an input level and an output level in a calculation procedure 3 according to the third embodiment.
Figure 18:
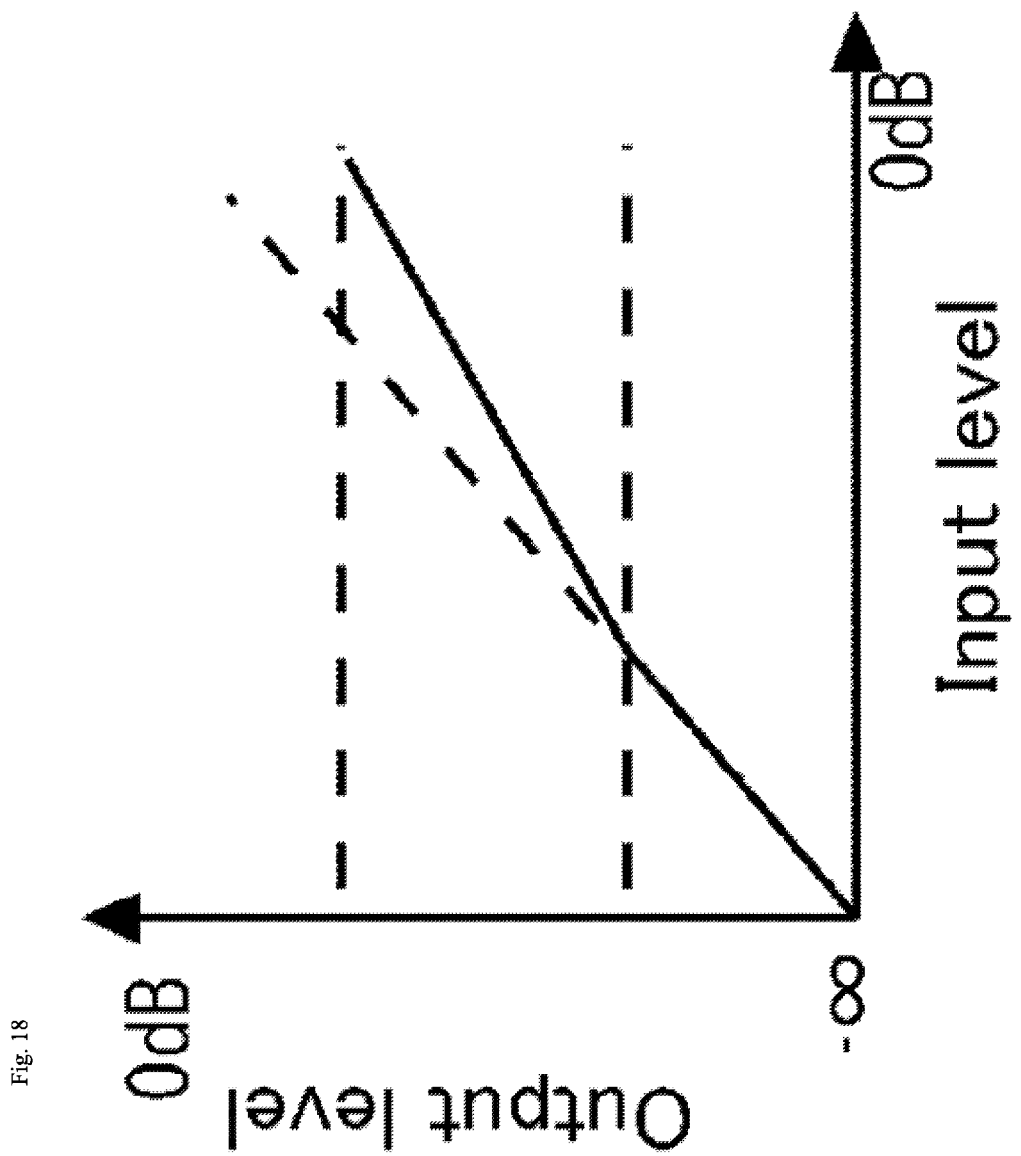
FIG. 18 is a view illustrating a relationship between an input level and an output level in a calculation procedure 3 according to the third embodiment.
Figure 19:
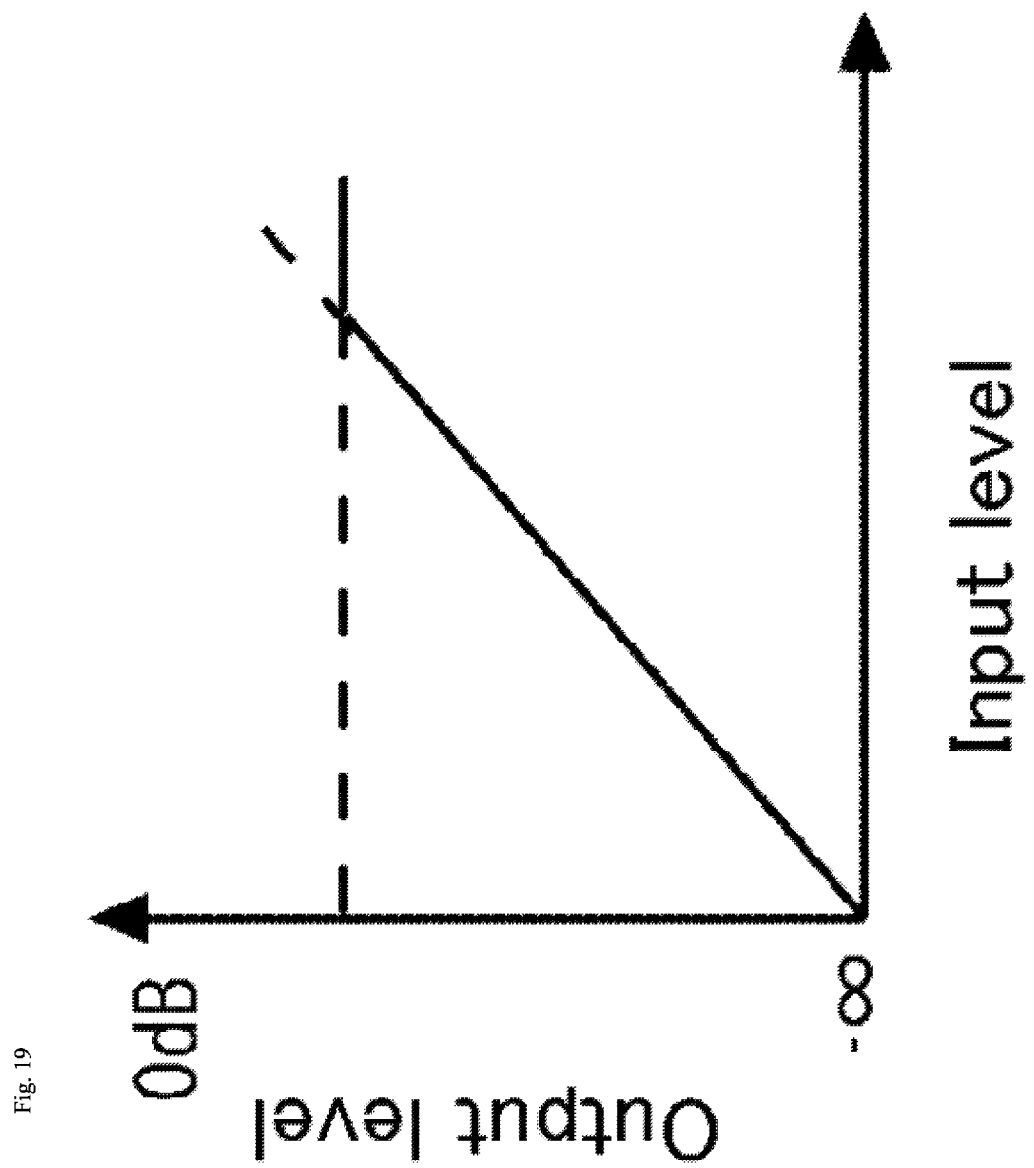
FIG. 19 is a view illustrating a relationship between an input level and an output level in a calculation procedure 3 according to the third embodiment.

The threshold value and compression ratio are made to vary simultaneously for control. When the threshold value is reduced, the compression ratio is reduced so as to make the output level corresponding to the maximum input constant. Thus, it is possible to suppress only the annoying audio signal to a viewer. As illustrated in FIGS. 17 and 18, when an input level becomes equal to or higher than a predetermined value, a corresponding output level is reduced as compared to conventional approaches. Further, as illustrated in FIG. 19, when an input level becomes equal to or higher than a predetermined value, an output level is limited to a certain value.

As described above, according to the present embodiment, it is possible to perform gain adjustment matching the auditory volume feeling actually experienced by a human more closely. Thus, a viewer can enjoy contents more comfortably. Note that the abovementioned technique may be applied in the reverse direction to the compression. That is, content such as an action movie contains, e.g., many active scenes where silence is abruptly broken by loud sound, such as an explosion scene, so that in such content, the scenes can be expressed more effectively. In such a case, processing may be applied so as not to compress but to amplify an audio signal.

Fourth Embodiment

The present embodiment is obtained by combining the third embodiment with the first or second embodiment. That is, as in the case of the first embodiment or second embodiment, the loudness level is used to adjust the long-term gain and short-term gain to allow adjustment of sound to an ear-friendly level while ensuring a dynamic range intended by a producer of contents to some extent. Further, as in the case of the third embodiment, the gain adjustment method is changed depending on a state of the volume level of the immediately previous audio signal in the case where the volume level abruptly and significantly changes at the time of switching from one input source or one scene to another.

Figure 20:
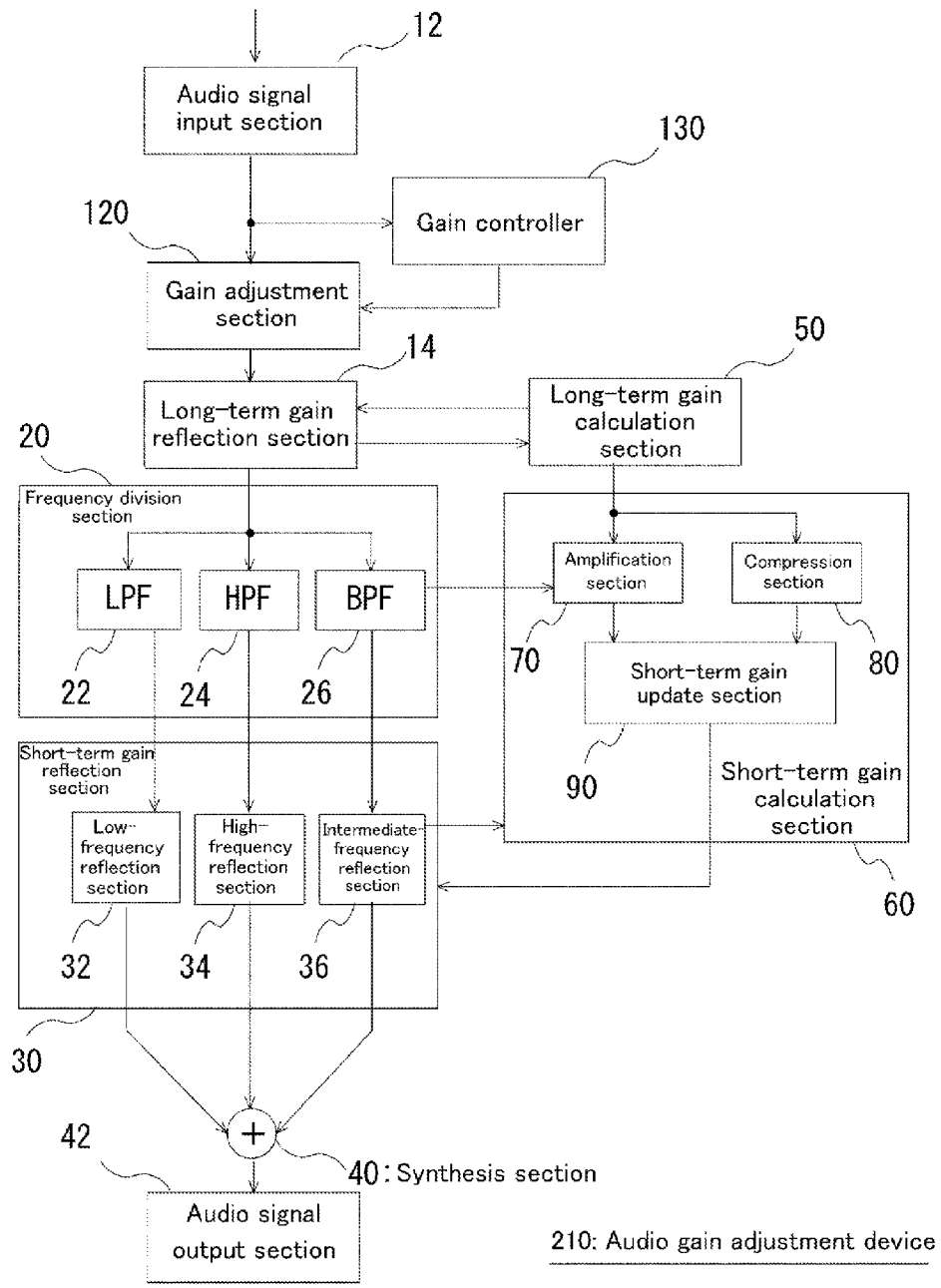
FIG. 20 is a function block diagram of the audio gain adjustment device according to a fourth embodiment.

FIG. 20 is a function block diagram of an audio gain adjustment device 210 according to the present embodiment, which illustrates an embodiment in which the configuration of the third embodiment is simply connected in series to the configuration of the first or second embodiment. The audio gain adjustment device 210 has a configuration obtained by additionally providing, in the audio gain adjustment device 10 of FIG. 1 of the first embodiment, the gain adjustment section 120 and gain controller 130 of the third embodiment between the audio signal input section 12 and long-term gain reflection section 14. The components represented by the same reference numerals have the same functions as those described above, and hence repeated descriptions thereof are omitted here.

Even when the gain adjustment section 120 and gain controller 130 are provided between the synthesis section 40 and audio signal output section 42, the same function and effect can be obtained.

As illustrated in FIG. 20, it is possible to adopt not only an embodiment in which the configuration of the third embodiment is simply connected in series to the configuration of the first or second embodiment. However, it is also possible to adopt an embodiment in which the configuration of the third embodiment is incorporated in a part calculating the compression target gain of the first or second embodiment. In this case, the processing amount can be reduced, as well as the compression target gain can be calculated effectively.

Figure 21:
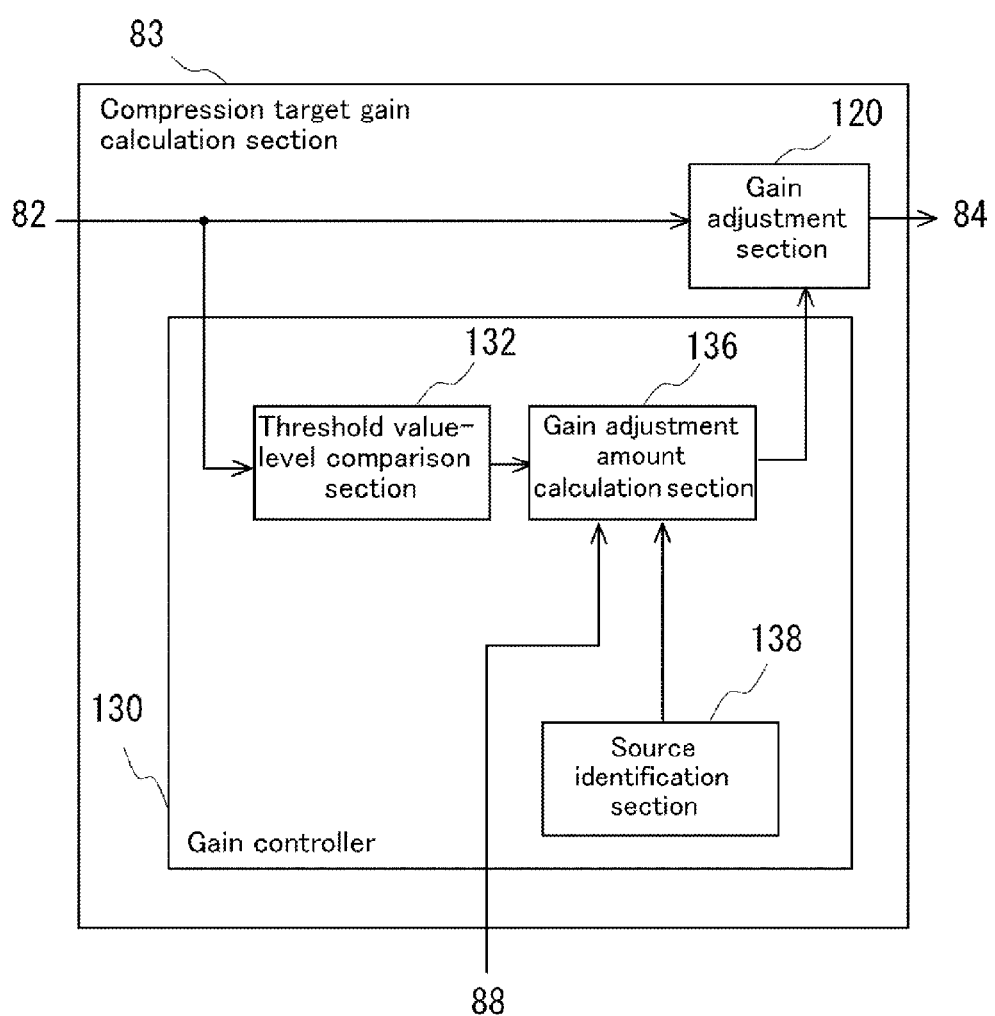
FIG. 21 is a function block diagrams illustrating a configuration of a compression target gain calculation section of the audio gain adjustment device according to the modification of the fourth embodiment.

FIG. 21 is a modification of the present embodiment and illustrates a configuration in which the gain adjustment section 120 and gain controller 130 are provided in the compression target gain calculation section 83 of the compression section 80 described in the first embodiment. The functions of the gain adjustment section 120 and gain controller 130 are substantially the same as those of the third embodiment but differ in that gain adjustment is performed not based on an audio signal but based on the loudness level. Alternatively, the gain adjustment section 120 and gain controller 130 may be provided in the compression target gain calculation section 83 of the compression section 80 of the second embodiment.

The gain controller 130 includes the threshold value-level comparison section 132, gain adjustment amount calculation section 136, and source identification section 138. In this configuration, the level change degree calculation section 134 is omitted, and the rising degree calculated in the level rising edge detection section 88 is used as the level change degree calculated in the level change degree calculation section 134.

The threshold value-level comparison section 132 compares the loudness level value acquired from the level-threshold value comparison section 82 and a preset threshold value level to calculate a difference level and notifies the gain adjustment amount calculation section 136 of the calculated difference level.

When the difference level calculated in the threshold value-level comparison section 132 is a positive value, that is, when the loudness level value of an audio signal exceeds a preset threshold value, the gain adjustment amount calculation section 136 calculates the compression ratio for calculating the compression target gain in accordance with the level change degree calculated in the level rising edge detection section 88 and outputs the calculated compression ratio to the gain adjustment section 120. When there is no output from the gain adjustment amount calculation section 136, that is, when the difference level calculated in the threshold value-level comparison section 132 is a negative value or zero, the gain adjustment section 120 refers to a result of the level-threshold value comparison processing performed in the level-threshold value comparison section 82 as in the above embodiment and, if necessary, re-calculates the compression target gain based on a difference between the compression threshold value and current loudness level. When there is an output from the gain adjustment amount calculation section 136, the gain adjustment section 120 uses the compression ratio calculated in the gain adjustment amount calculation section 136 in place of the loudness level input from the level-threshold value comparison section 82 to calculate the compression target gain and outputs the calculated compression target gain to the compression gain change width calculation section 84. Then, the source identification section 138 identifies the content in the same manner as described above. Information of the identified content is reflected in the compression ratio calculation processing in the gain adjustment amount calculation section 136. With the above configuration and processing, in the case where the gain adjustment method is changed depending not only on the momentary volume level but also on a state of the volume level of the immediately previous audio signal, the processing can be executed using the loudness level closer to the auditory sense of a human. In this case, characteristics of the content can be reflected.

Although the functions of the gain adjustment section 120 and gain controller 130 are included in the compression target gain calculation section 93 in the above example, they may be included in the level-threshold value comparison section 82 or compression gain change width calculation section 84.

EXPLANATION OF REFERENCE SYMBOLS 10, 110, 210: Audio gain adjustment device
12: Audio signal input section
14: Long-term gain reflection section
20: Frequency division section
22: LPF
24: HPF
26: BPF
30: Short-term gain reflection section
32: Low-frequency reflection section
34: High-frequency reflection section
36: Intermediate-frequency reflection section
40: Synthesis section
42: Audio signal output section
50, 50a: Long-term gain calculation section
52: Audio signal storage section
53: Output sound pressure characteristics application section
54: Loudness level conversion section
56: Level comparison/count section
58: Long-term gain update section
60, 60a: Short-term gain calculation section
70, 70a: Amplification section
71: Audio signal storage section
72: Loudness level conversion section
73: Level-threshold value comparison section
74: Level rising edge detection section
75: Amplification target gain calculation section
76: Amplification gain change width calculation section
77: Output sound pressure characteristic application section
80: Compression section
81: Long-term gain adjustment section
82: Level-threshold value comparison section
83: Compression target gain calculation section
84: Compression gain change width calculation section
85: Loudness level storage section
86: Average level calculation section
87: Level standard deviation calculation section
88: Level rising-edge detection section
90: Short-term gain update section
130: Gain controller
132: Threshold value-level comparison section
134: Level change degree calculation section
136: Gain adjustment amount calculation section
138: Source identification section
140: Long-term gain reflection section

The invention claimed is:

1. An audio signal adjustment device characterized by comprising:
   long-term gain adjustment means for relatively controlling an amplitude of an input signal on a long-term basis; and
   short-term gain adjustment means for relatively controlling the amplitude of the input signal on a short-term basis,
   wherein the short-term gain adjustment means reflects a signal that has been subjected to the long-term gain control performed by the long-term gain adjustment means so as to perform control of the amplitude of the input signal.

2. The audio signal adjustment device according to claim 1, characterized in that,
   when controlling the amplitude of the input signal, the long-term gain adjustment means converts the input signal into a loudness level which is a level based on auditory sense of a human.

3. The audio signal adjustment device according to claim 1, characterized in that,
   when controlling the amplitude of the input signal, the short-term gain adjustment means converts the input signal into a loudness level which is a level based on auditory sense of a human.

4. The audio signal adjustment device according to claim 1, characterized in that
the long-term gain adjustment means reflects output sound pressure characteristics of audio output means which is an output destination of a signal of the audio signal adjustment device to control the amplitude of the input signal.

5. The audio signal adjustment device according to claim 1, characterized in that
the short-term gain adjustment means reflects output sound pressure characteristics of audio output means which is an output destination of a signal of the audio signal adjustment device to control the amplitude of the input signal.

6. The audio signal adjustment device according to claim 1, characterized in that
the long-term gain adjustment means and short-term gain adjustment means each control the amplitude based on the input signal buffered for a certain period of time.

7. The audio signal adjustment device according to claim 6, characterized in that
the input signal buffered for a certain period of time is a read-ahead signal.

8. The audio signal adjustment device according to claim 1, characterized in that
the long-term gain adjustment means reflects an input signal that has been subjected to previous long-term gain control so as to perform feed-back control.

9. The audio signal adjustment device according to claim 1, characterized in that
the short-term gain adjustment means performs control of the amplitude of the input signal for each of a band for human voice and another band of the input signal.

10. The audio signal adjustment device according to claim 1, characterized in that
the short-term gain adjustment means changes attack time in accordance with the rising degree of an input signal in controlling the amplitude of the short-term gain.

11. The audio signal adjustment device according to claim 10, characterized in that
the short-term gain adjustment means calculates the rising degree of the input signal based on the loudness level of the input signal and standard deviation and average value of the loudness level.

12. The audio signal adjustment device according to claim 1, characterized in that
the short-term gain adjustment means changes the amplitude amount of the short-term gain in accordance with the rising degree of the loudness level of the input signal in controlling the amplitude of the short-term gain.

13. The audio signal adjustment device according to claim 1, characterized in that
the short-term gain adjustment means calculates a change width of the short-term gain every time the short-term gain adjustment means calculates a target gain of the input signal.

14. The audio signal adjustment device according to claim 1, characterized in that
the long-term gain adjustment means adjusts the long-term gain in accordance with a change in the control of the short-term gain in the short-term gain adjustment means.

15. The audio signal adjustment device according to claim 1, characterized by comprising:
comparison means for comparing a level of the input signal and a preset threshold value level so as to calculate a difference level;
level change degree calculation means for comparing a level of the input signal input within a given past time period and a level of the input signal currently being input so as to calculate a level change degree;
gain adjustment amount calculation means for calculating the adjustment amount of the gain used in gain adjustment processing to be applied to the input signal in accordance with the difference level calculated in the comparison means; and
gain adjustment means for applying adjustment to the input signal according to the gain adjustment amount calculated in the gain adjustment amount calculation means.

16. The audio signal adjustment device according to claim 15, characterized by comprising a source/content identification means for identifying a source of the input signal or a category of a content including the input signal, characterized in that
the gain adjustment amount calculation means can set a calculation procedure of the gain adjustment amount depending on the source or category identified by in the source/content identification means.

* * * * *